United States Patent
Mori et al.

(10) Patent No.: US 11,127,440 B2
(45) Date of Patent: Sep. 21, 2021

(54) PSEUDO STATIC RANDOM ACCESS MEMORY AND METHOD FOR OPERATING PSEUDO STATIC RANDOM ACCESS MEMORY

(71) Applicant: Winbond Electronics Corp., Taichung (TW)

(72) Inventors: Kaoru Mori, Kanagawa (JP); Yukihiro Nomura, Kanagawa (JP)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 16/799,843

(22) Filed: Feb. 25, 2020

(65) Prior Publication Data

US 2020/0273504 A1 Aug. 27, 2020

(30) Foreign Application Priority Data

Feb. 25, 2019 (JP) .............................. JP2019-032118

(51) Int. Cl.
| | |
|---|---|
| *G11C 8/00* | (2006.01) |
| *G11C 7/10* | (2006.01) |
| *G11C 11/4076* | (2006.01) |
| *G11C 7/22* | (2006.01) |
| *G11C 11/406* | (2006.01) |

(52) U.S. Cl.
CPC .......... *G11C 7/1045* (2013.01); *G11C 7/1048* (2013.01); *G11C 7/1072* (2013.01); *G11C 7/22* (2013.01); *G11C 11/4076* (2013.01); *G11C 11/40615* (2013.01)

(58) Field of Classification Search
CPC ... G11C 7/1045; G11C 7/1048; G11C 7/1072; G11C 7/22; G11C 11/40615; G11C 11/4076

USPC ..................................................... 365/233.1
See application file for complete search history.

(56) References Cited

U.S. PATENT DOCUMENTS

| | | | |
|---|---|---|---|
| 6,415,339 B1 | 7/2002 | Farmwald et al. | |
| 7,251,171 B2 * | 7/2007 | Nishimura ........... | G11C 7/1045 365/189.02 |
| 10,153,014 B1 * | 12/2018 | Mazumder ........... | G11C 29/022 |
| 2005/0162957 A1 * | 7/2005 | Oh ........................ | G11C 11/406 365/222 |

(Continued)

FOREIGN PATENT DOCUMENTS

| | | |
|---|---|---|
| CN | 101266833 | 9/2008 |
| TW | 201709065 | 3/2017 |

*Primary Examiner* — Viet Q Nguyen
(74) *Attorney, Agent, or Firm* — JCIPRNET

(57) ABSTRACT

A pseudo static random access memory including a plurality of memory chips and an information storing device is provided. The memory chips transmit a plurality of read/write data strobe signals to a memory controller by using a same bus. Regardless of whether a self refresh collision occurs in the memory chips, when the memory chips perform a read operation, read latency of the memory chips is set to be a fixed period that self refresh is allowed to be completed. The fixed period is greater than initial latency. The information storing device is configured to store information which defines the fixed period. The read/write data strobe signal indicates whether the self refresh collision occurs in the memory chips, and a level of the read/write data strobe signals is constant during the read latency. A method for operating a pseudo static random access memory is also provided.

20 Claims, 17 Drawing Sheets

(56) References Cited

U.S. PATENT DOCUMENTS

| | | | |
|---|---|---|---|
| 2005/0169091 A1* | 8/2005 | Miki | G11C 11/406 365/230.03 |
| 2009/0154257 A1* | 6/2009 | Fujioka | G11C 7/1066 365/189.05 |
| 2009/0245003 A1* | 10/2009 | Ito | G11C 7/04 365/211 |
| 2012/0066464 A1* | 3/2012 | Zitlaw | G06F 12/16 711/162 |

* cited by examiner

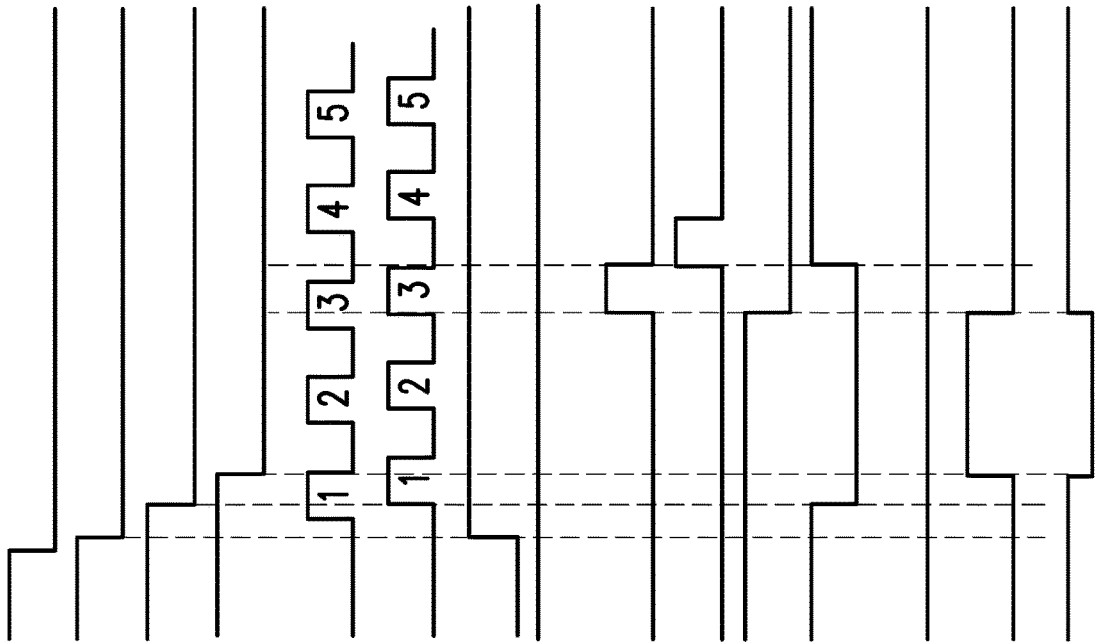
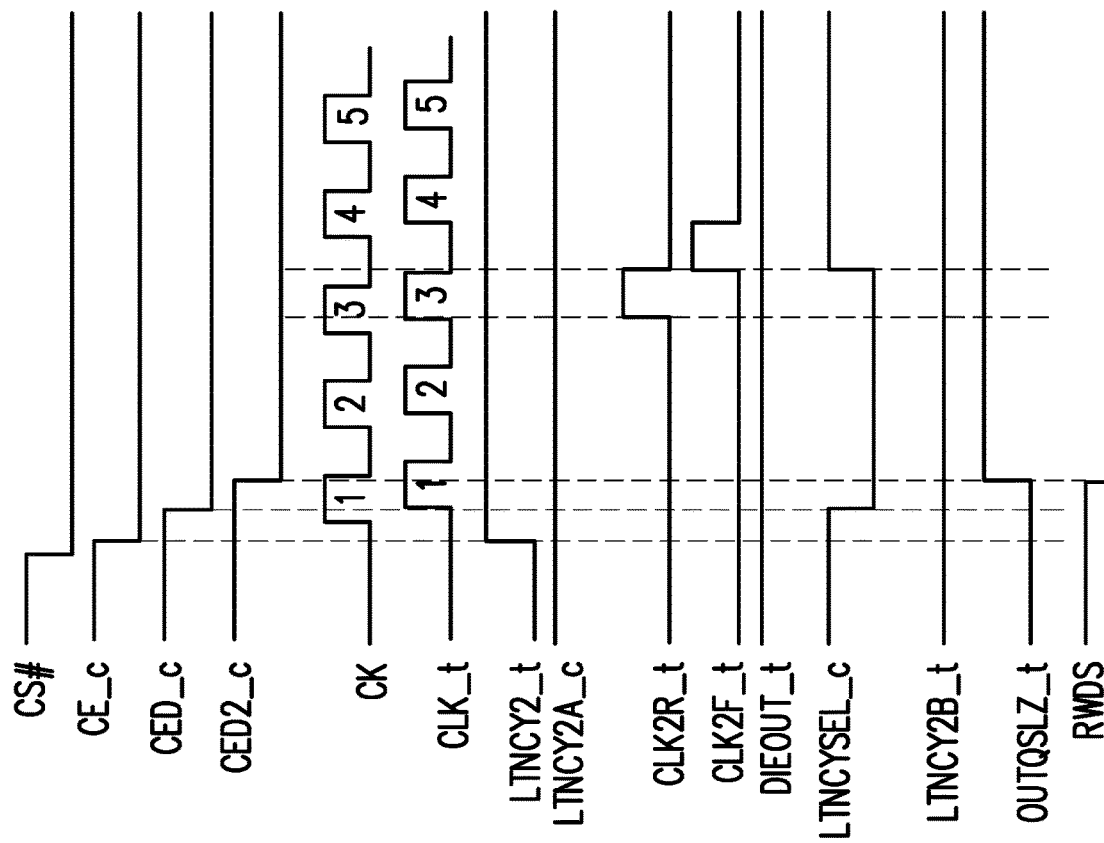
FIG. 15B
FIG. 15A

PSEUDO STATIC RANDOM ACCESS MEMORY AND METHOD FOR OPERATING PSEUDO STATIC RANDOM ACCESS MEMORY

CROSS-REFERENCE TO RELATED APPLICATION

This application claims the priority benefit of Japan application serial no. 2019-032118, filed on Feb. 25, 2019. The entirety of the above-mentioned patent application is hereby incorporated by reference herein and made a part of this specification.

BACKGROUND OF THE DISCLOSURE

1. Field of the Disclosure

The disclosure relates to a memory and a method for operating the memory, and in particular, to a pseudo static random access memory and a method for operating a pseudo static random access memory.

2. Description of Related Art

A pseudo static random access memory (hereinafter referred to as pSRAM) uses a dynamic random access memory (DRAM) as a memory cell array to store data. Furthermore, an access interface of the DRAM is redesigned to be compatible with an access interface of a static random access memory (SRAM), and a characteristic of an access timing sequence of the DRAM is also similar to that of the SRAM. The pSRAM may use an expanded serial peripheral interface (hereinafter referred to as xSPI) or a HyperBus™ interface as its access interface. The pSRAM using the xSPI as the access interface is called as an xSPI pSRAM, and the pSRAM using the HyperBus™ as the access interface is called as a HyperRAM pSRAM.

In a burst read/write operation of a memory device, desired minimum latency time from the start of the burst read/write operation to output/writing of valid data is defined as initial latency. When self refresh occurs during the initial latency, it is called a self refresh collision. FIG. 1 and FIG. 2 respectively are diagrams illustrating signal timing sequences in which the self refresh collision occurs and no self refresh collision occurs when conventional memory chips perform a read operation. In the xSPI pSRAM or HyperRAM pSRAM, the memory chip outputs a read/write data strobe signal (hereinafter referred to as an RWDS signal) from a read/write data strobe pin (hereinafter referred to as an RWDS pin) to a memory controller when a control signal CS# is at a low level, so as to inform the memory controller of information whether the self refresh collision occurs and to determine the latency time of data input/output accordingly. When no self refresh collision occurs, as shown in FIG. 1, the RWDS pin will output a low-level RWDS signal. A read latency of the memory chip is one unit (for example, 3 cycles of a clock signal CK) of cycle latency (i.e., the initial latency). When the self refresh collision occurs, as shown in FIG. 2, the RWDS pin outputs a high-level RWDS signal and falls to a low level after 3 CK cycles. In this way, the read latency of the memory chip is set to be two units of cycle latency, so that the valid data is not output until the self refresh is completed. The data is thereby ensured not to be damaged. Therefore, during the read operation, one additional unit of cycle latency is set to be added to the memory chip according to occurrence of the self refresh collision, which causes the read latency to be inconstant.

In addition, in response to the demand for miniaturization, a conventional memory package structure includes a plurality of stacked memory chips, thereby increasing a memory density. In order not to change a bus width, these memory chips may transmit the RWDS signals by using a same bus. However, the self refresh operations of these memory chips are asynchronous. If these memory chips output the RWDS signals at different levels at the same time, a bus conflict problem may occur. Current consumption may thus increase and an unexpected voltage drop may occur. In addition, due to process variations, even if these memory chips output RWDS signals at the high levels at the same time, since the fast-responding memory chips do not undergo a change of the RWDS signals from the high level to a low level in the read latency, the slow-responding memory chips may undergo the above-mentioned change in the same period, the bus conflict problem thereby occurs.

SUMMARY OF THE DISCLOSURE

The disclosure provides a pSRAM and a method for operating the pSRAM in which a bus conflict is prevented.

A pSRAM of the disclosure is coupled to a memory controller and includes a plurality of memory chips and an information storing device. The memory chips transmit a plurality of read/write data strobe signals to the memory controller by using a same bus. Regardless of whether a self refresh collision occurs in the memory chips, when the memory chips perform a read operation, read latency of the memory chips is set to be a fixed period for allowing completion of self refresh. The fixed period is greater than initial latency. The information storing device is configured to store information defining the fixed period. The read/write data strobe signal indicates whether the self refresh collision occurs in the memory chips, and a level of the read/write data strobe signal is constant during the read latency.

The method for operating the pSRAM of the disclosure includes the following steps. Information defining a fixed period for allowing completion of self refresh is stored in an information storing device. Regardless of whether a self refresh collision occurs in memory chips, when the memory chips perform a read operation, read latency of the memory chips is set to be the fixed period. The fixed period is greater than initial latency. A plurality of read/write data strobe signals are transmitted to a memory controller by using a same bus. The read/write data strobe signal indicates whether the self refresh collision occurs in the memory chips, and a level of the read/write data strobe signal is constant during the read latency.

In order to make the foregoing features and advantages of the present disclosure more comprehensible, embodiments are hereinafter described in detail with reference to the accompanying drawings.

BRIEF DESCRIPTION OF THE DRAWINGS

FIG. 15A is a general diagram illustrating waveforms of main signals of a signal generation circuit in a first memory chip according to the fifth embodiment.

FIG. 15B is a general diagram illustrating waveforms of main signals of a signal generation circuit in a second memory chip according to the fifth embodiment.

DESCRIPTION OF THE EMBODIMENTS

A plurality of embodiments are provided below to explain the present disclosure, but the present disclosure is not limited to the illustrated plurality of embodiments. Appropriate combinations are also allowed between embodiments.

Figure 1:
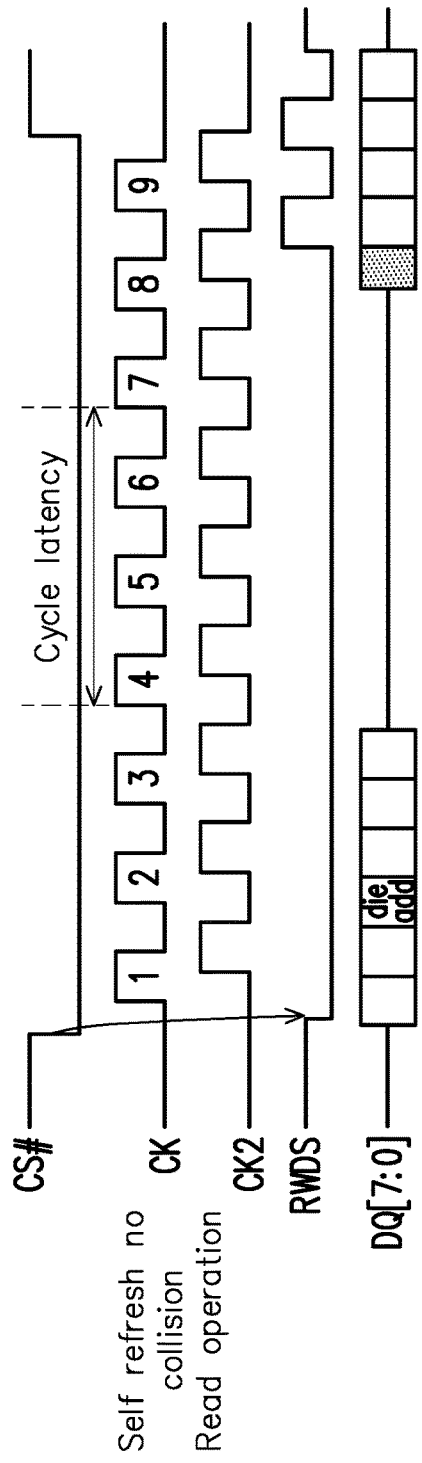
FIG. 1 and FIG. 2 are diagrams illustrating signal timing sequences of conventional memory chips.
Figure 2:
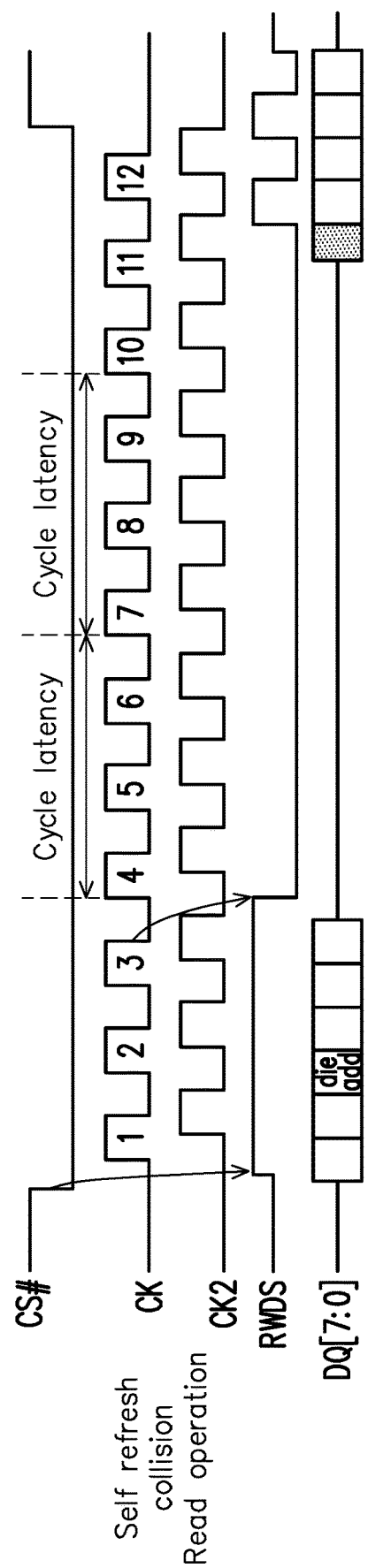
Figure 3:
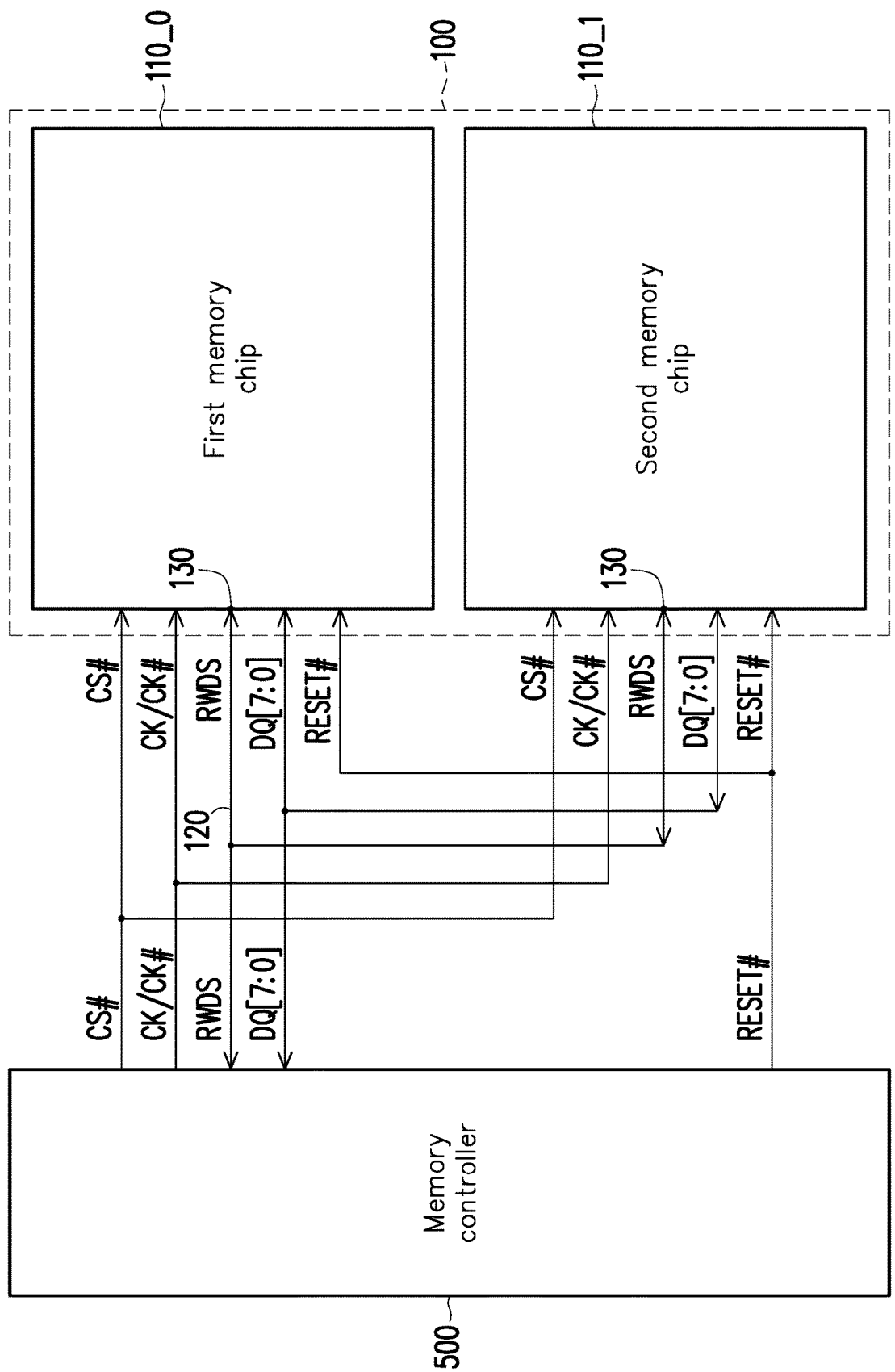
FIG. 3 is a schematic general diagram illustrating a pSRAM and a memory controller thereof according to one embodiment of the disclosure.

FIG. 3 is a schematic general diagram illustrating a pSRAM and a memory controller thereof according to one embodiment of the disclosure. Referring to FIG. 3, the pSRAM 100 of the present embodiment includes a plurality of memory chips. A first memory chip 110_0 and a second memory chip 110_1 are exemplified for illustration here. However, the number of memory chips is not intended to limit the disclosure. In the present embodiment, the first memory chip 110_0 and the second memory chip 110_1 share a control signal CS# and a read/write data strobe (RWDS) signal. Each memory chip outputs the RWDS signal through an RWDS pin 130, and transmits the RWDS signal by using a same bus 120. A data signal DQ [7:0] includes a chip address. In the embodiment of FIG. 3, the first memory chip 110_0 and the second memory chip 110_1 are, for example, expanded serial peripheral interface (xSPI) pSRAMs or HyperRAM pSRAMs, but not limited thereto. In the embodiment of the disclosure, regardless of whether self refresh collision occurs, when the memory chips perform a read operation, read latency of the memory chips is set to be a fixed period that self refresh is allowed to be completed. Furthermore, levels of all the RWDS signals in the read latency are constant. The fixed period is greater than the initial latency.

Figure 4:
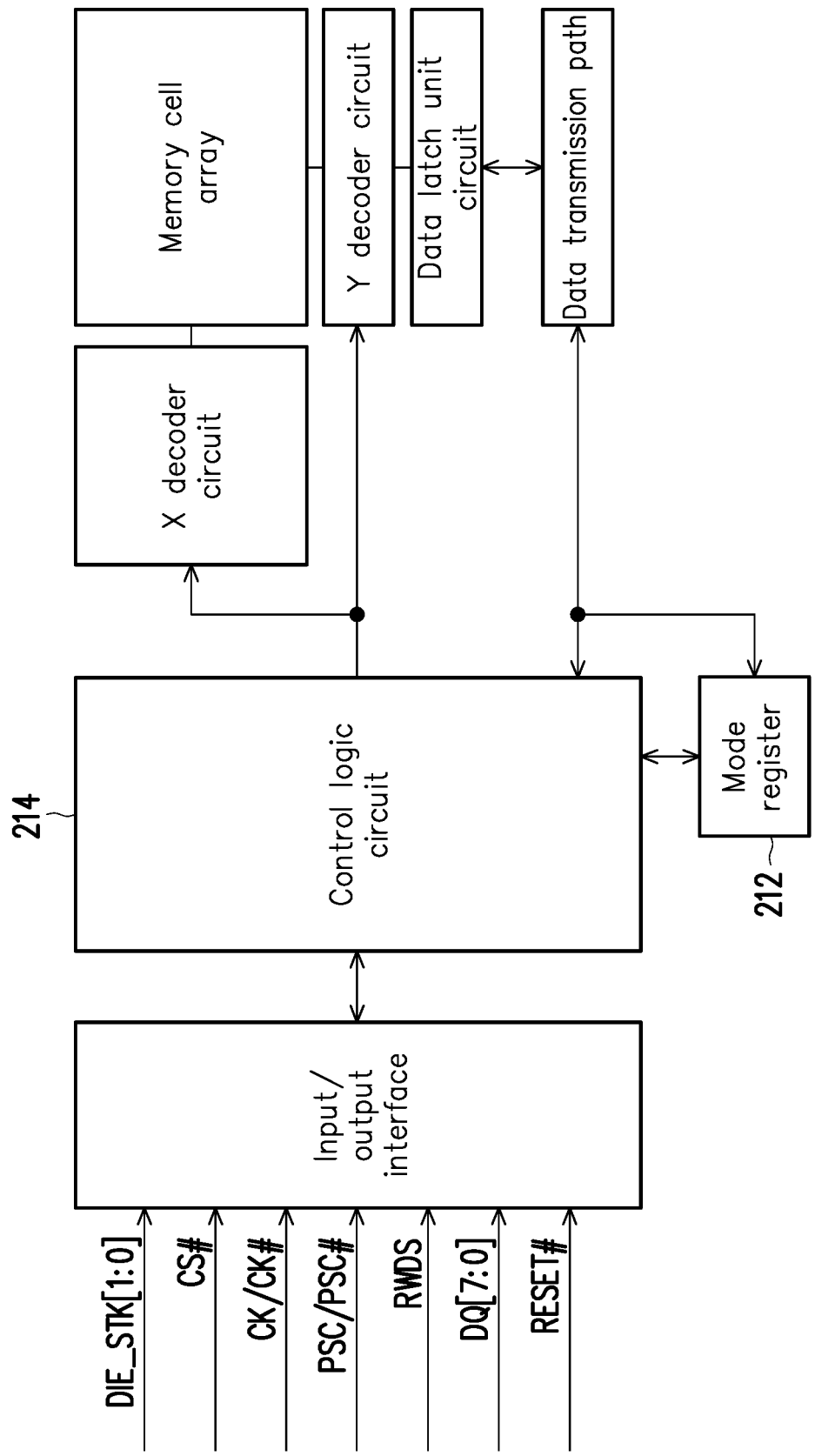
FIG. 4 is a schematic general diagram illustrating a memory chip according to one embodiment of the disclosure.

FIG. 4 is a schematic general diagram of a memory chip according to one embodiment of the disclosure. Referring to FIG. 3 and FIG. 4, an internal structure of the first memory chip 110_0 or the second memory chip 110_1 of FIG. 3 is identical to that of a memory chip 210 shown in FIG. 4. The memory chip 210 includes a mode register 212 and a control logic circuit 214. In the present embodiment, a memory controller 500 sets a read latency of the memory chip as fixed information which is stored in the mode register 212.

In the present embodiment, the memory chip 210 further includes elements such as an input/output interface, an X decoder circuit, a Y decoder circuit, a memory cell array, a data latch unit circuit, and a data transmission path. Enough teaching, suggestion and implementation illustrations can be obtained from general knowledge in the art for detailed functions and implementation manners of the elements.

Figure 5:
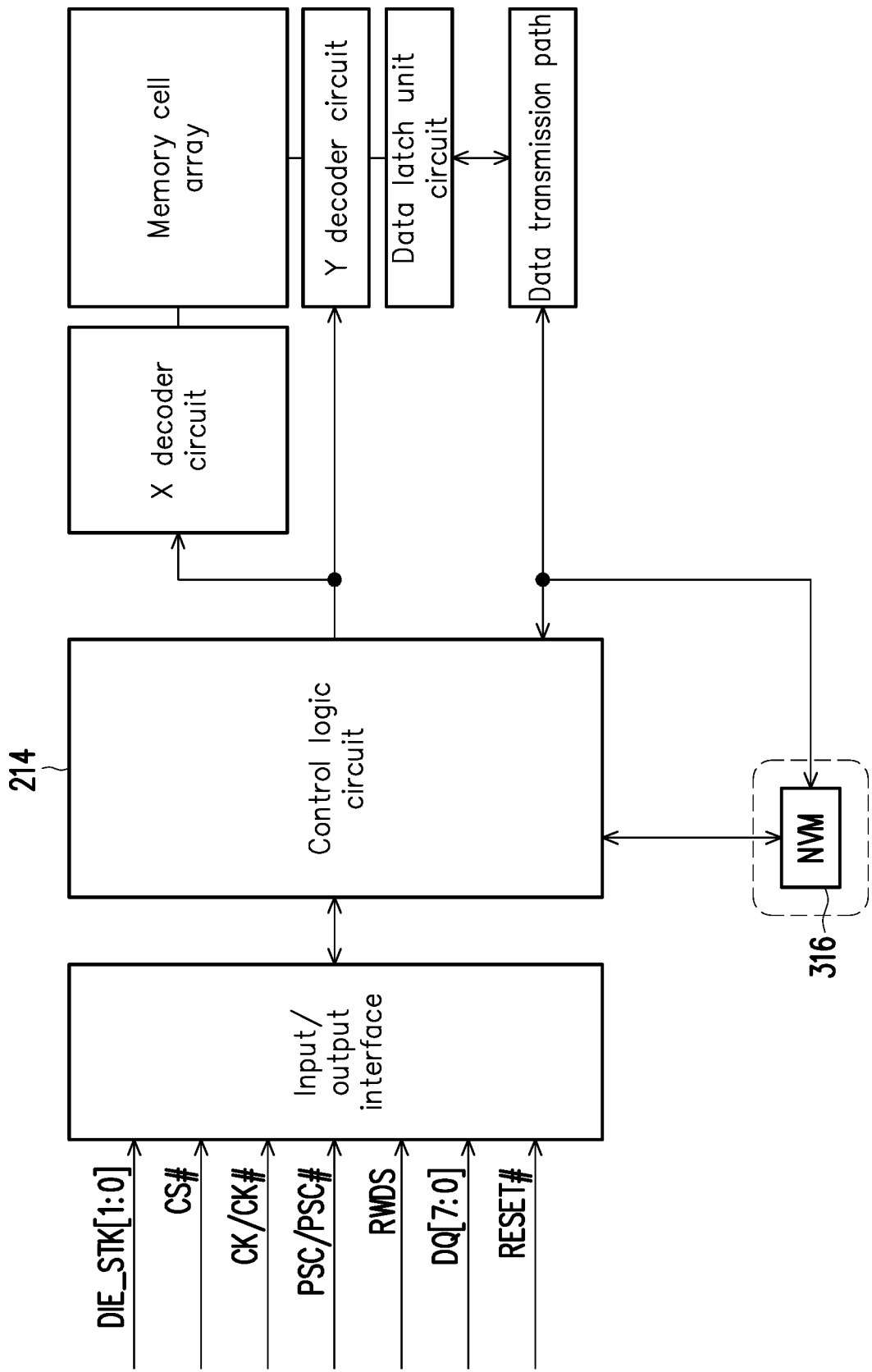
FIG. 5 is a schematic general diagram illustrating a memory chip according to another embodiment of the disclosure.

FIG. 5 is a schematic general diagram illustrating a memory chip according to another embodiment of the disclosure. Referring to FIG. 3 and FIG. 5, the internal structure of the first memory chip 110_0 or the second memory chip 110_1 of FIG. 3 is identical to that of a memory chip 310 shown in FIG. 5. The memory chip 310 includes a non-volatile memory (NVM) 316 and a control logic circuit 214. In the present embodiment, the NVM 316 includes, for example, an efuse. The efuse may be programmed to set the read latency into the NVM 316 as fixed information.

Figure 6:
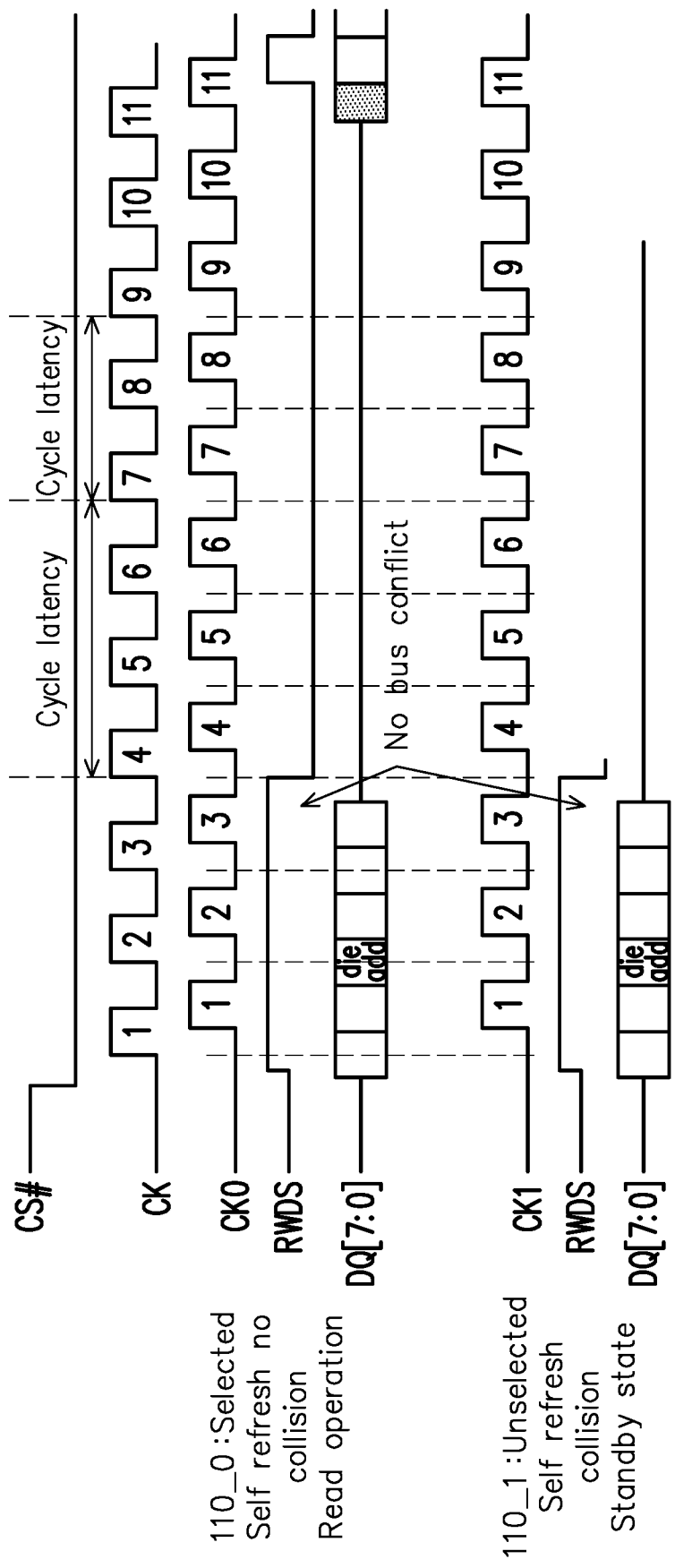
FIG. 6 is diagram illustrating signal timing sequences of the memory chips according to a first embodiment of the disclosure.

FIG. 6 is a diagram illustrating signal timing sequences of the memory chips according to a first embodiment of the disclosure. The first memory chip 110_0 is selected to perform a read operation, and no self refresh collision occurs in the first memory chip 110_0. The second memory chip 110_1 is not selected, i.e. in a standby state, while a self refresh collision occurs in the second memory chip 110_1. The read latency of the first memory chip 110_0 is set to be a fixed period (for example, two units of cycle latency) that self refresh operation is allowed to be completed.

In the present embodiment, a chip address is input at a rising edge of a second clock of a clock signal CK, and is marked as "die add" in the data signal DQ [7:0]. A portion marked by oblique lines in the data signal DQ [7:0] indicates that data is read out. In addition, when the control signal CS# changes from a high level to a low level, the first memory chip 110_0 outputs an RWDS signal at a high level. At the same time, the second memory chip 110_1 also outputs an RWDS signal at a high level. Therefore, the bus conflict may be avoided at least before the read latency (i.e., at a time interval from a first clock to a third clock of the clock signal CK).

Figure 7:
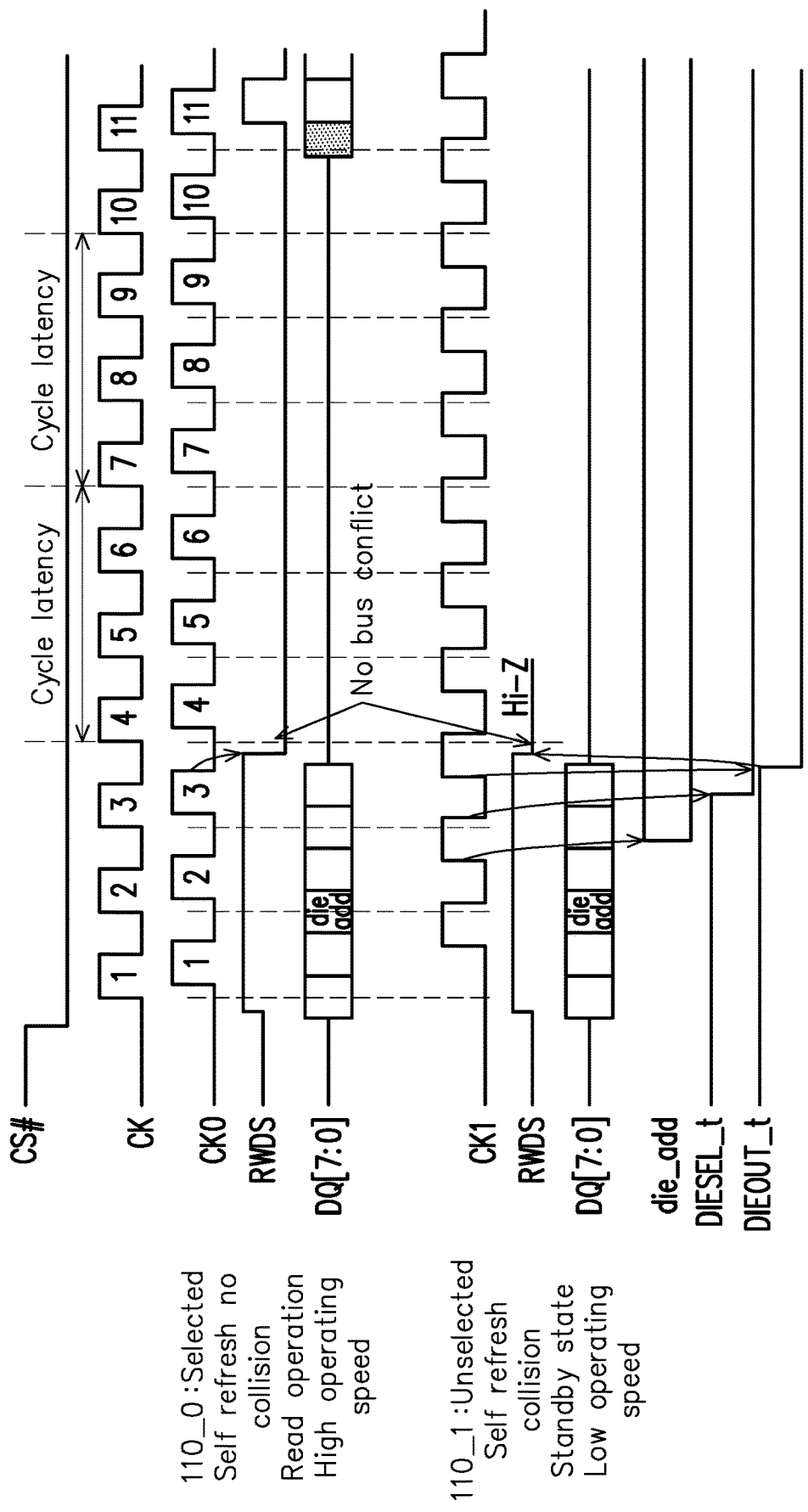
FIG. 7 is a diagram illustrating signal timing sequences of the memory chips according to a second embodiment of the disclosure.

FIG. 7 is a diagram illustrating signal timing sequences of the memory chips according to a second embodiment of the disclosure. Referring to FIG. 3 and FIG. 7, in the second embodiment, the first memory chip 110_0 and the second memory chip 110_1 are, for example, xSPI pSRAMs. The first memory chip 110_0 is selected to perform a read operation, and no self refresh collision occurs in the first memory chip 110_0. The second memory chip 110_1 is not selected and is in a standby state. The first memory chip 110_0 and the second memory chip 110_1 are manufactured by different wafer manufacturing procedures to have different operating speeds. In the present embodiment, the first memory chip 110_0 has a higher operating speed. The read latency of the first memory chip 110_0 is set to be a fixed period (for example, two units of cycle latency) that self refresh is allowed to be completed.

In the present embodiment, when the control signal CS# changes to a low level, the first memory chip 110_0 and the second memory chip 110_1 both output RWDS signals at high levels. Furthermore, before or when the RWDS signal of the first memory chip 110_0 changes from a high level to a low level, the RWDS pin 130 of the second memory chip 110_1 changes to a high-impedance (Hi-Z) state. In detail, the chip address is input at the rising edge of the second clock of the clock signal CK, and is marked as "die add" in the data signal DQ [7:0]. In response to the clock signal CK, the first memory chip 110_0 generates an internal clock signal CK0, and the second memory chip 110_1 generates an internal clock signal CK1. A rising edge of a first clock of the internal clock signal CK0 is earlier than a rising edge of a first clock of the internal clock signal CK1. In response to a rising edge of a second clock of the internal clock signal CK1, the chip address is latched as an internal chip address die_add. In response to a falling edge of the second clock of the internal clock signal CK1, each memory chip decodes the internal chip address die_add. In the present embodiment, a chip selection signal DIESEL_t of the second memory chip 110_1 is at a low level after decoding, so as to indicate that the second memory chip is not selected. In response to a rising edge of a third clock of the internal clock signal CK1, the chip selection signal DIESEL_t is latched to generate a chip output signal DIEOUT_t, so as to determine the chip address. In response to the chip selection signal DIESEL_t at a low level, the chip output signal DIEOUT_t of the second memory chip 110_1 is at a low level, so that the RWDS pin 130 of the second memory chip 110_1 is in a Hi-Z state. At the same time, in response to a falling edge of a third clock of the internal clock signal CK0 of the first memory chip 110_0, the RWDS signal of the first memory chip 110_0 changes to a low level. The rising edge of the third clock of the internal clock signal CK1 of the second memory chip 110_1 is earlier than the falling edge of the third clock of the internal clock signal CK0 of the first memory chip 110_0. In another non-illustrated embodiment, before the RWDS signal of the first memory chip 110_0 changes to the low level, the RWDS signal of the second memory chip 110_1 changes to a Hi-Z state.

Therefore, according to a method for operating the memory chips of the second embodiment, even if these memory chips have different operating speeds, the problem of the bus conflict may also be avoided between the first memory chip 110_0 and the second memory chip 110_1.

Figure 8:
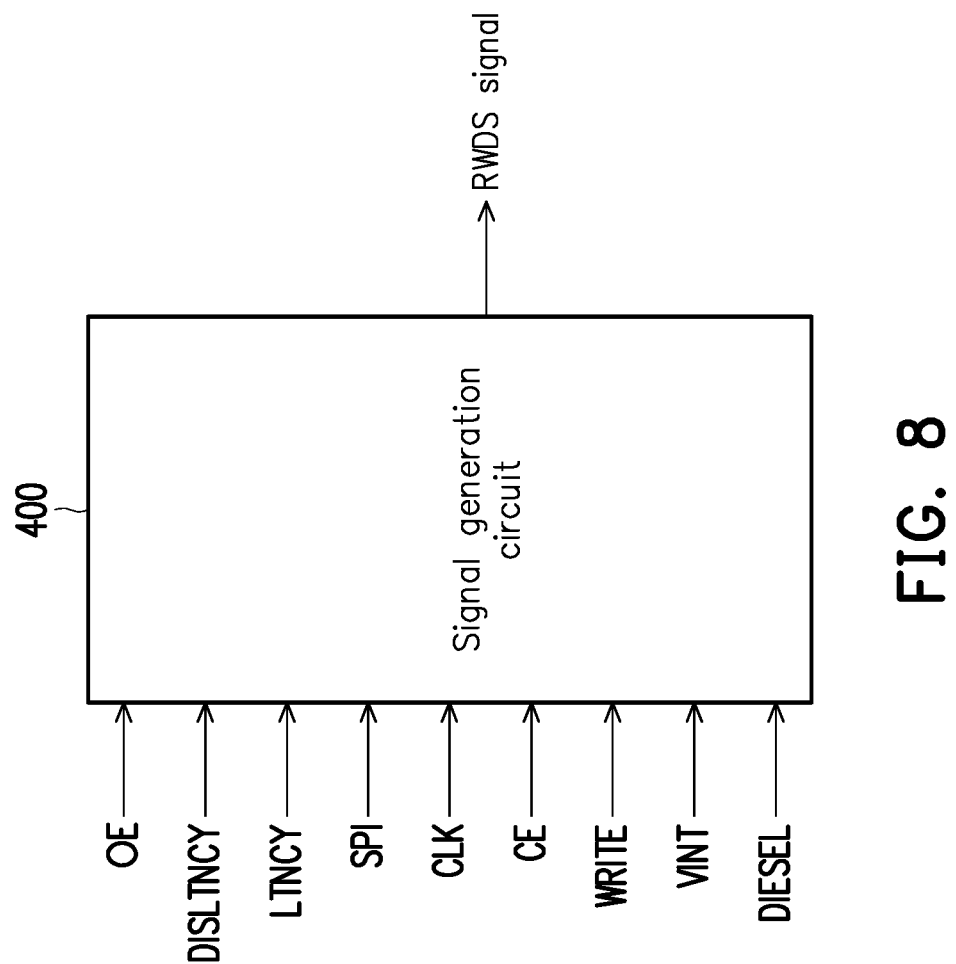
FIG. 8 is a schematic general diagram illustrating a signal generation circuit according to one embodiment of the disclosure.
Figure 9:
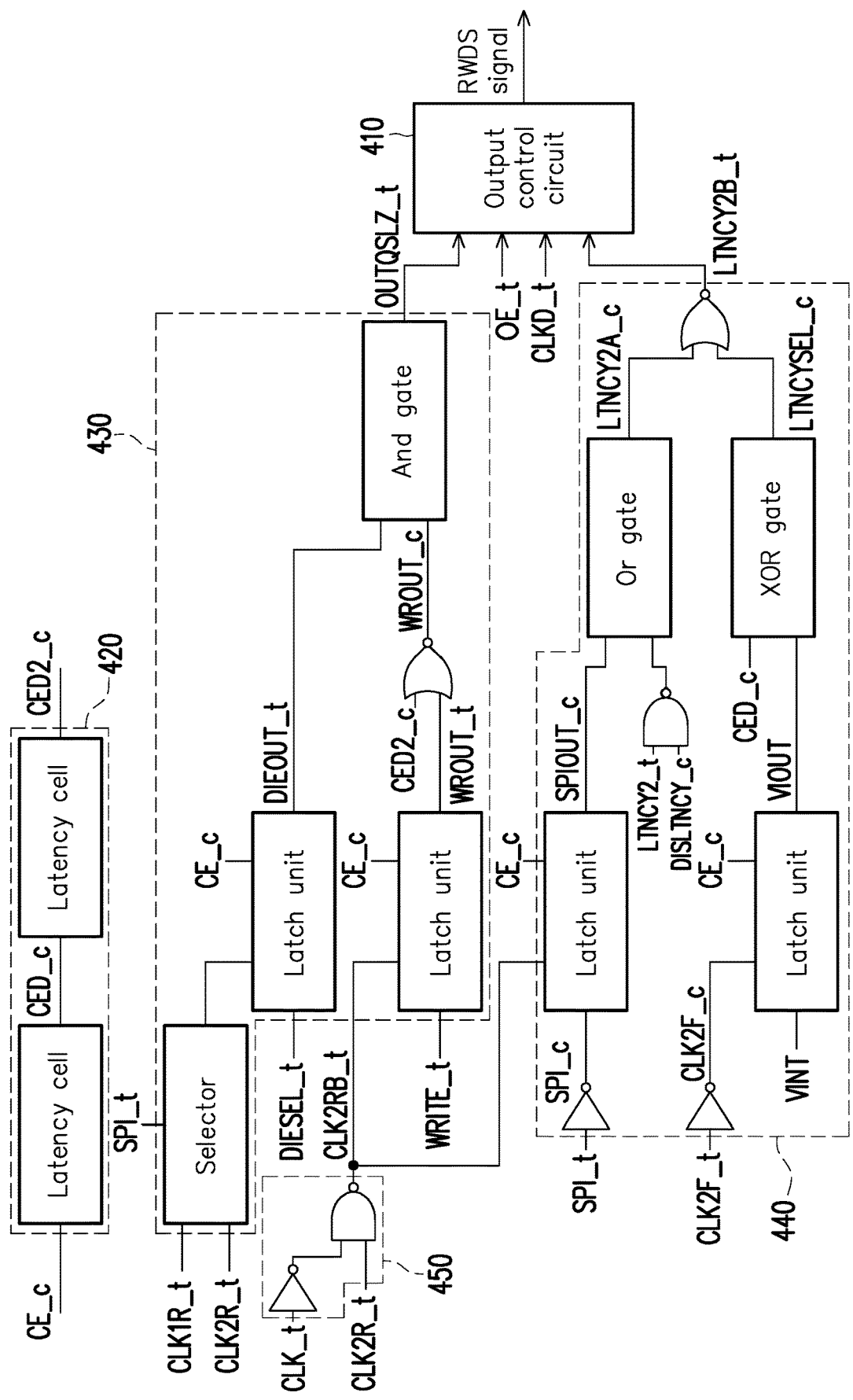
FIG. 9 is a schematic diagram illustrating an internal part of the signal generation circuit of the embodiment of FIG. 8.

FIG. 8 is a schematic general diagram illustrating a signal generation circuit according to one embodiment of the disclosure. FIG. 9 is a schematic diagram illustrating an internal part of the signal generation circuit of the embodiment of FIG. 8. Referring to FIG. 8 and FIG. 9, the signal generation circuit 400 is, for example, arranged in the control logic circuit 214 in FIG. 4 or FIG. 5. In one embodiment, the signal generation circuit 400 may also be arranged in other circuit blocks of the memory chips 210 and 310.

In the present embodiment, the signal generation circuit 400 includes an output control circuit 410, a latency circuit 420, an RWDS signal control circuit 430, a read latency determination circuit 440, and a pulse generation circuit 450. The signal generation circuit 400 is configured to generate an RWDS signal, and output the RWDS signal to the RWDS pin 130 of the memory chip. In detail, the latency circuit 420 includes two latency units which are respectively configured to generate delayed internal control signals CED_c and CED2_c according to an internal control signal CE_c. The internal control signal CE_c is generated in response to the control signal CS#. The RWDS signal control circuit 430 includes a selector, two latch units, an NOR gate, and an AND gate. The selector is configured to output a signal CLK1R_t or a signal CLK2R_t according to a mode setting signal SPI_t. One latch unit of the RWDS signal control circuit 430 receives the chip selection signal DIESEL_t and the output of the selector, and outputs the signal DIEOUT_t according to the internal control signal CE_c. The other latch unit of the RWDS signal control circuit 430 receives a write operation-related signal WRITE_t and an output of the pulse generation circuit 450, and outputs a signal WROUT_t according to the internal control signal CE_c. The NOR gate performs a logic operation on the delayed internal control signal CED2_c and the signal WROUT_t, and outputs a signal WROUT_c. The AND gate performs a logic operation on the signal DIEOUT_t and the signal WROUT_t, and outputs a signal OUTQSLZ_t. The read latency determination circuit 440 includes two inverters, two latch units, and a plurality of logic gates. One inverter of the read latency determination circuit 440 inverts the signal SPI_t into a signal SPI_c. The other inverter of the read latency determination circuit 440 inverts a signal CLK2F_t into a signal CLK2F_c. One latch unit of the read latency determination circuit 440 receives the signal SPI_c and the output of the pulse generation circuit 450, and outputs a signal SPIOUT_c according to the internal control signal CE_c. The other latch unit of the read latency determination circuit 440 receives the signal CLK2F_c and a signal VINT, and outputs a signal VIOUT according to the internal control signal CE_c. The plurality of logic gates of the read latency determination circuit 440 performs a logic operation on the signal SPIOUT_c, a signal LTNCY2_t, a signal DISLTN-CY_c, the delayed internal control signal CED_c and the signal VIOUT, so as to output a signal LTNCY2B_t. The output control circuit 410 is configured to control the output of the RWDS signal, and is coupled to the RWDS signal control circuit 430 and the read latency determination circuit 440, and outputs the RWDS signal according to the signal OUTQSLZ_t, a signal OE_t, an internal control signal CLKD_t and the signal LTNCY2B_t. The pulse generation circuit 450 outputs a signal CLK2RB_t according to an internal clock signal CLK_t and the signal CLK2R_t. In FIG. 8, OE represents an output enabling signal; LTNCY and DISLTNCY represent latency-related signals; SPI represents a memory chip type-related signal, for example, the signal SPI of the xSPI pSRAM is at a high level, and the signal SPI of the HyperRAM pSRAM is at a low level; CLK represents an internal clock signal of the selected memory chip; CE represents a chip enabling signal; VINT represents an internal voltage-related signal; and the internal control signal CLKD_t is a data output-related signal. In FIG. 9, OUTQSLZ_t may be configured to enable the RWDS pin 130 to be in the Hi-Z state. The signal generation circuit 400 and the output control circuit 410 are hardware circuits designed through a hardware description language (HDL) or any other digital circuit design methods familiar to those skilled in the art and implemented by means of a field programmable gate array (FPGA), a complex programmable logic device (CPLD), or an application-specific integrated circuit (ASIC). Enough teaching, suggestion and implementation illustrations can be obtained from general knowledge in the art for detailed functions and implementation manners of the signal generation circuit 400 and the output control circuit 410.

The method for operating the memory chips of the second embodiment is taken for example. FIG. 10A is a general diagram illustrating waveforms of main signals of the signal generation circuit 400 in the first memory chip 110_0, and FIG. 10B is a general diagram illustrating the waveforms of the main signals of the signal generation circuit 400 in the second memory chip 110_1.

Figure 10B:
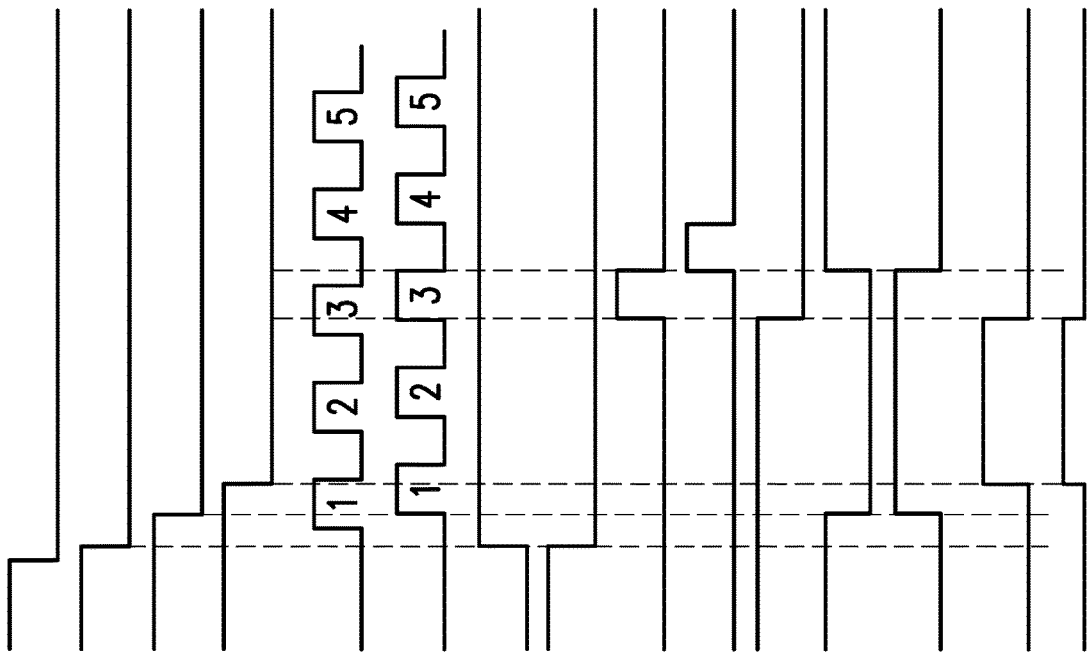
FIG. 10B is a general diagram illustrating waveforms of main signals of a signal generation circuit in a second memory chip according to the second embodiment.
Figure 10A:
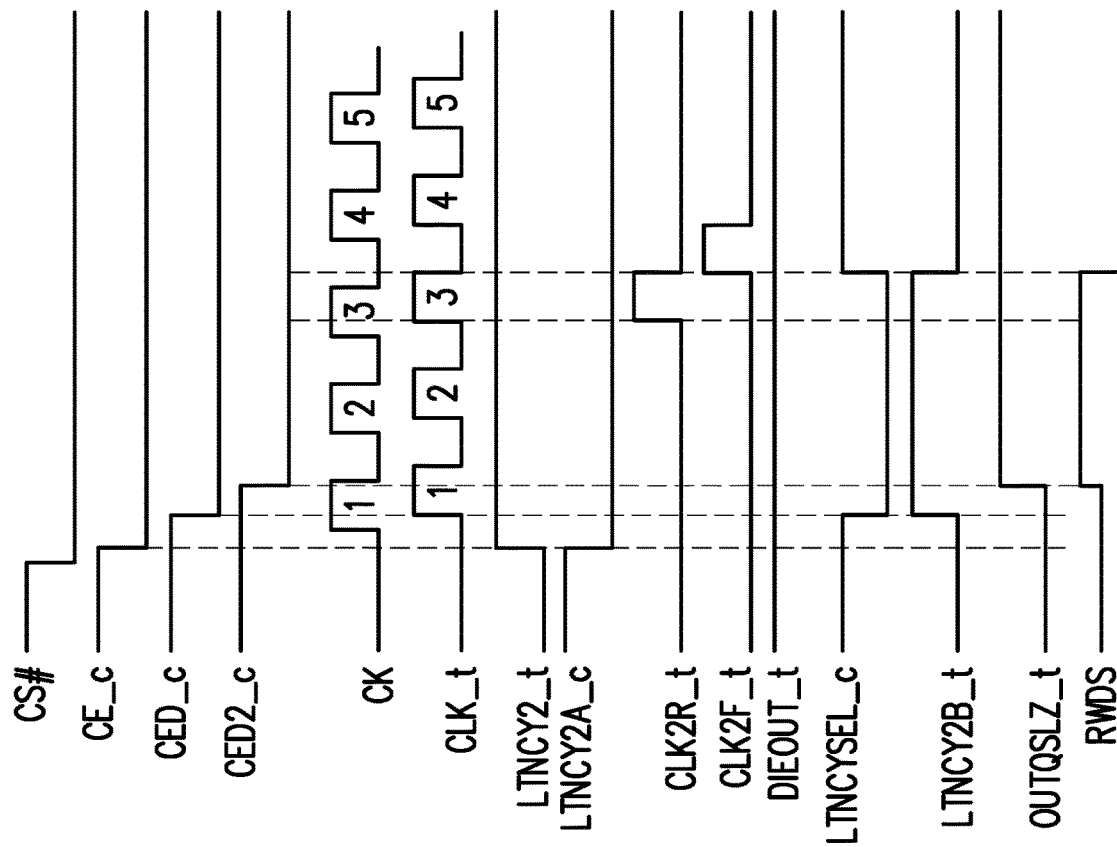
FIG. 10A is a general diagram illustrating waveforms of main signals of a signal generation circuit in a first memory chip according to the second embodiment.

Referring to FIG. 10A and FIG. 10B, in FIG. 10A, when the signal CED2_c changes to a low level, the RWDS signal changes to a high level. The signal CLK2F_t changes to a high level at a falling edge of a third clock of the clock signal CLK_t, and at this time, the RWDS signal changes to a low level. In FIG. 10B, when the signal CED2_c changes to a low level, the RWDS signal changes to a high level. The signal CLK2R_t changes to a high level at a rising edge of the third clock of the clock signal CLK_t, and at this time, the RWDS pin 130 is in a Hi-Z state.

Referring to FIG. 9 and FIG. 10A to FIG. 10B, in FIG. 10A and FIG. 10B, when the signal CE_c is at a low level, the signal LTNCY2_t changes to a high level. At the same time, the signal SPIOUT_c is at a low level, and then the signal LTNCY2A_c changes to a low level. The signal VIOUT is at a low level, and the signal CED_c is at a high level. Then, the signal LTNCYSEL_c is at a high level, and the signal LTNCY2B_t is at a low level.

When the signal CED_c is at a low level, the signal LTNCYSEL_c changes to a low level. Since the signal LTNCY2A_c is at the low level, and the signal LTNCYSEL_c is at the low level, the signal LTNCY2B_t changes to a high level.

When the signal CED2_c is at a low level, the signal WROUT_c changes to a high level, which is an inverted value of a signal WROUT_t at a low level. Since the signal DIEOUT_t is at a high level, and the signal WROUT_c is at the high level, the signal OUTQSLZ_t changes to a high level, and the RWDS signal changes to a low level. Since the signal LTNCY2B_t is at the high level, and the signal OUTQSLZ_t is at the high level, the RWDS pin 130 is in a Hi-Z state.

When the signal CLK2R_t is at a high level, in the unselected chip, the signal DIESEL_t is latched, and the signal DIEOUT_t changes to a low level. Since the signal DIEOUT_t is at the low level, the signal OUTQSLZ_t changes to a low level, and in the unselected chip, the RWDS pin 130 is in a Hi-Z state.

When the signal CLK2R_t is at the high level, and the signal CLK_t is at a low level, the signal WRITE_t is latched. During the write operation, the signal WROUT_t is at a high level, and the signal WROUT_c changes to a low level. Then, the signal OUTQSLZ_t changes to a low level, and the RWDS pin 130 is in a Hi-Z state. During the read operation, the signal WROUT_t is at a low level, and the signal WROUT_c remains at a high level, and then the signal OUTQSLZ_t remains at a high level. The signal SPI_c is latched. Since FIG. 10A and FIG. 10B disclose an embodiment of the xSPI pSRAM, the signal SPI_c is at a low level, and the signal SPIOUT_c remains at the low level.

When the signal CLK2F_t is at a high level, the signal VINT is latched, and the signal VIOUT changes to a high level. Then, the signal LTNCYSEL_c changes to a high level, and the signal LTNCY2B_t changes to a low level. Since the signal OUTQSLZ_t is at the high level, and the signal LTNCY2B_t is at the low level, in the selected chip, the RWDS signal changes to a low level.

Figure 11:
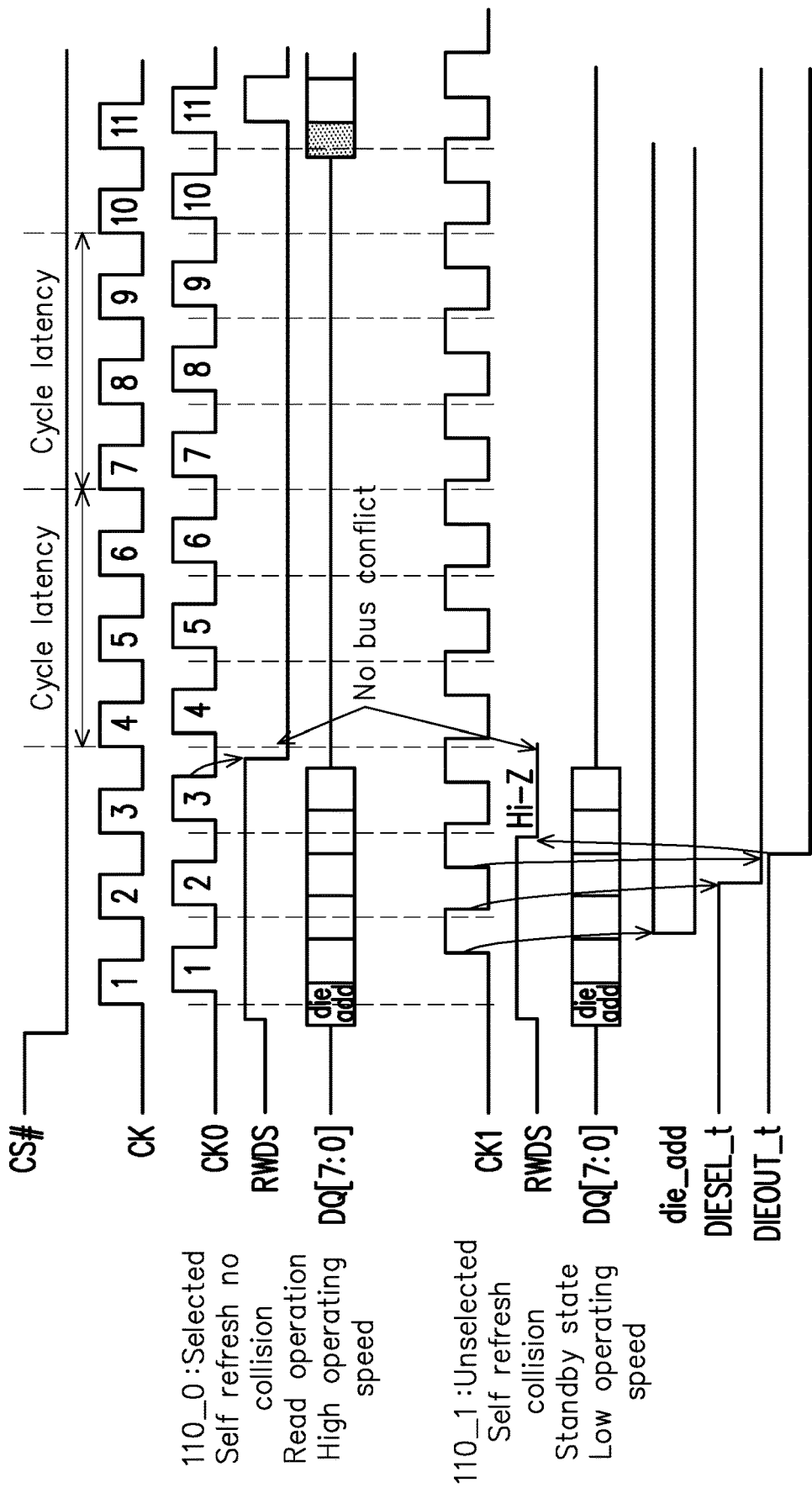
FIG. 11 is a diagram illustrating signal timing sequences of the memory chips according to a third embodiment of the disclosure.

FIG. 11 is diagram illustrating signal timing sequences of the memory chips according to a third embodiment of the disclosure. A main difference between the third embodiment and the second embodiment is that in the third embodiment, a chip address is input at a rising edge of a first clock of the clock signal CK. The first memory chip 110_0 and the second memory chip 110_1 are, for example, HyperRAM pSRAMs.

In detail, the chip address is input at the rising edge of the first clock of the clock signal CK, and is marked as "die add" in the data signal DQ [7:0]. In response to the rising edge of the first clock of the internal clock signal CK1, the chip address is latched as an internal chip address die_add. In response to a falling edge of the first clock of the internal clock signal CK1, each memory chip decodes the internal chip address die_add. In the present embodiment, a chip selection signal DIESEL_t of the second memory chip 110_1 is at a low level after decoding. In response to the rising edge of the second clock of the internal clock signal CK1, the chip selection signal DIESEL_t is latched to generate a chip output signal DIEOUT_t. In response to the chip selection signal DIESEL_t at a low level, the chip output signal DIEOUT_t of the second memory chip 110_1 is at a low level, so that the RWDS pin 130 of the second memory chip 110_1 is in a Hi-Z state. Then, in response to the falling edge of the third clock of the internal clock signal CK0 of the first memory chip 110_0, the RWDS signal of the first memory chip 110_0 changes to a low level. According to the present embodiment, before the RWDS signal of the first memory chip 110_0 changes to the low level, the RWDS pin 130 of the second memory chip 110_1 has been in a Hi-Z state.

Therefore, according to the third embodiment, even if these memory chips have different operating speeds, the problem of the bus conflict may also be avoided between the first memory chip 110_0 and the second memory chip 110_1.

Figure 12:
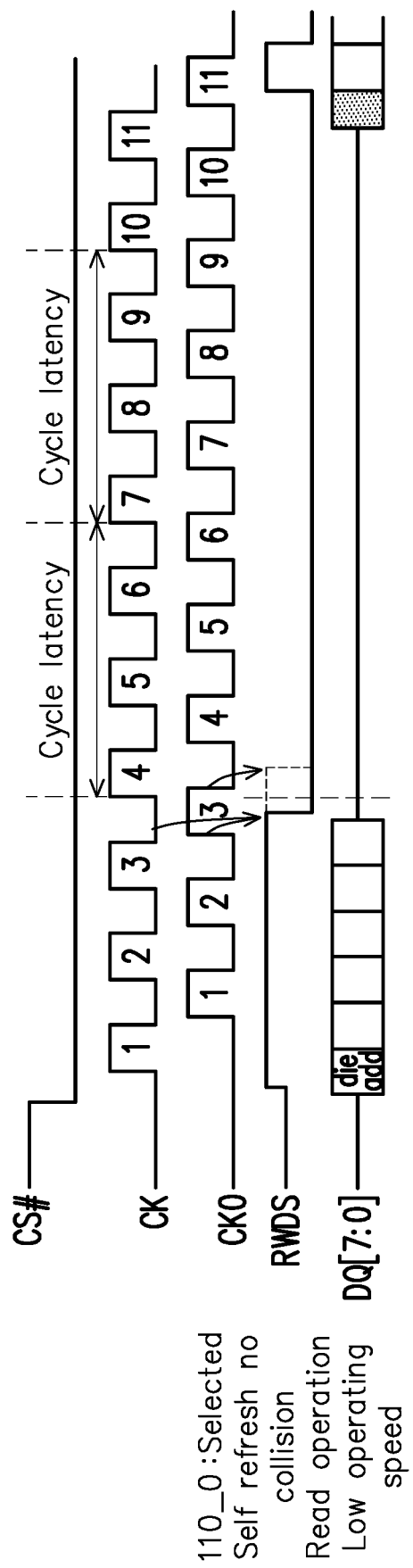
FIG. 12 is a diagram illustrating signal timing sequences of the memory chips according to a fourth embodiment of the disclosure.

FIG. 12 is a diagram illustrating signal timing sequences of the memory chips according to a fourth embodiment of the disclosure. A main difference between the fourth embodiment and the third embodiment is that the first memory chip 110_0 has a lower operating speed. In the present embodiment, before the falling edge of the third clock of the internal clock signal CK0 of the first memory chip 110_0, the RWDS signal of the first memory chip 110_0 changes to a low level. For example, in response to a rising edge of the third clock of the internal clock signal CK0, the RWDS signal of the first memory chip 110_0 changes to a low level. The rising edge of the third clock of the internal clock signal CK0 is earlier than a rising edge of a fourth clock of the clock signal CK. That is, before the initial latency, the first memory chip 110_0 outputs an RWDS signal at a low level.

Figure 13B:
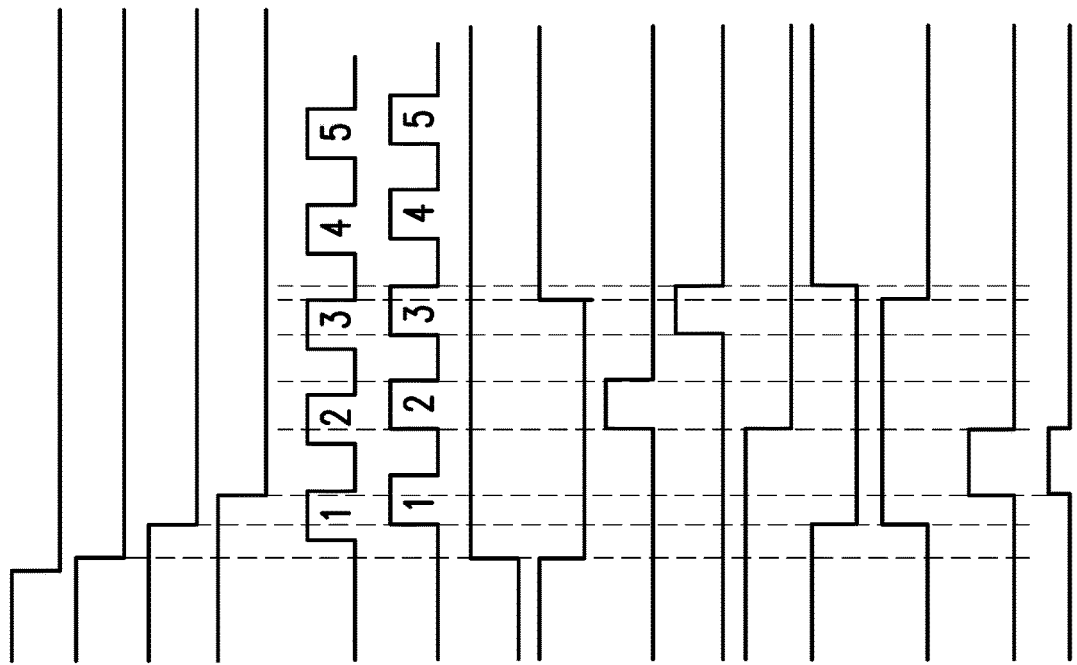
FIG. 13B is a general diagram illustrating main signals of a signal generation circuit in a second memory chip according to the fourth embodiment.
Figure 13A:
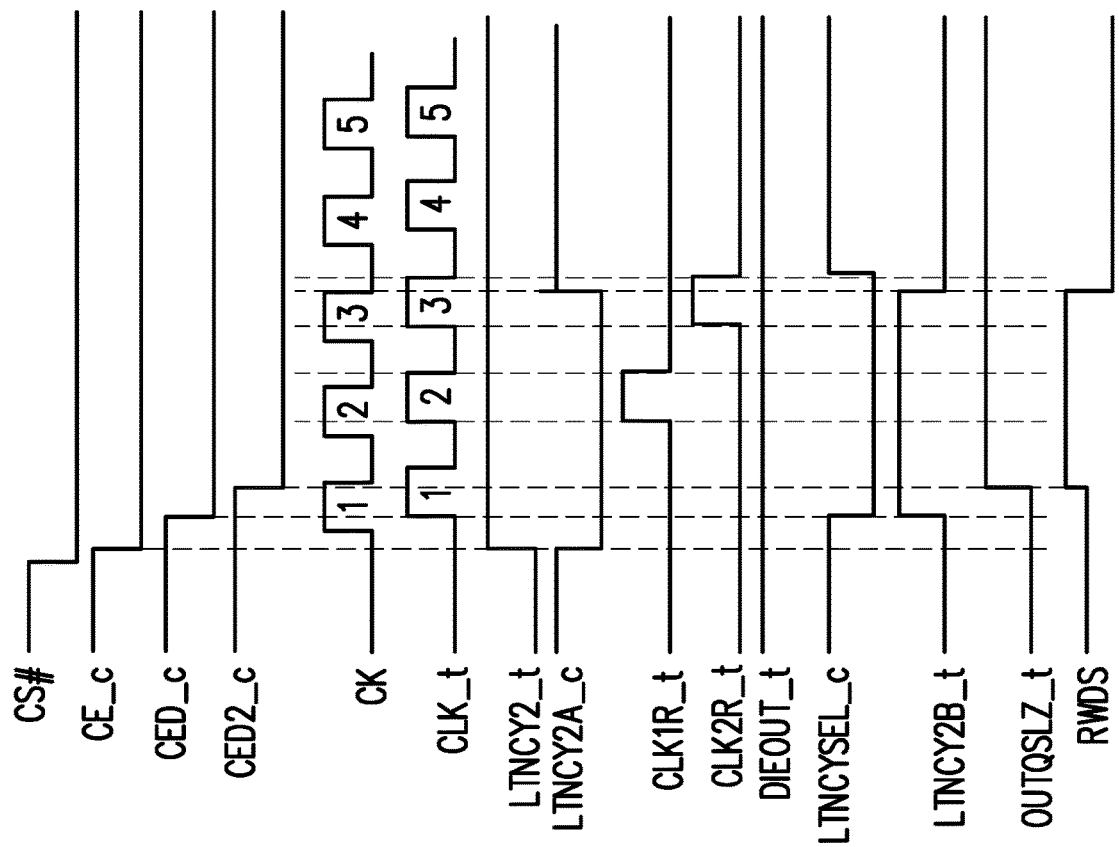
FIG. 13A is a general diagram illustrating waveforms of main signals of a signal generation circuit in a first memory chip according to the fourth embodiment.

A method for operating the memory chips of the fourth embodiment is taken for example. FIG. 13A is a general diagram illustrating waveforms of main signals of the signal generation circuit 400 in the first memory chip 110_0, and FIG. 13B is a general diagram illustrating waveforms of main signals of the signal generation circuit 400 in the second memory chip 110_1. In the fourth embodiment, the first memory chip 110_0 is selected to perform a read operation, and no self refresh collision occurs in the first memory chip 110_0. The second memory chip 110_1 is not selected (in a standby state) and a self refresh collision occurs in the second memory chip 110_1.

Referring to FIG. 13A and FIG. 13B, compared to the third embodiment, in the fourth embodiment, a reset time of the signal LTNCY2A_c is determined by the signal CLK2R_t and the clock signal CK. When the signal CLK2R_t is at a high level, and the clock signal CK is at a low level, the signal LTNCY2A_c is reset. At the same time, the signal LTNCY2B_c changes to a low level. Therefore, before the falling edge of the third clock of the internal clock signal CK0, the RWDS signal of the first memory chip 110_0 may change into a low level.

Referring to FIG. 9 and FIG. 13A to FIG. 13B, in FIG. 13A and FIG. 13B, when the signal CE_c is at a low level, the signal CED_c is at a low level, and the signal CED2_c is at a low level, a circuit operation manner thereof is similar to that of the embodiment of FIG. 10A and FIG. 10B.

When the signal CLK1R_t is at a high level, in the unselected chip, the signal DIESEL_t is latched, and the signal DIEOUT_t changes to a low level. Since the signal DIEOUT_t is at the low level, the signal OUTQSLZ_t changes to a low level, and in the unselected chip, the RWDS pin 130 is in a Hi-Z state.

When the CLK2R_t is at a high level, and the signal CLK_t is at a low level, the signal WRITE_t is latched, and a circuit operation manner thereof is similar to that of the embodiment of FIG. 10A and FIG. 10B. The signal SPI_c is latched. Since FIG. 13A and FIG. 13B disclose an embodiment of the HyperRAM pSRAM, the signal SPI_c is at a high level, and the signal SPIOUT_c changes to a high level. Then, the signal LTNCY2A_c changes to a high level, and the signal LTNCY2B_t changes to a low level. Since the signal OUTQSLZ_t is at the high level, and the signal LTNCY2B_t is at the low level, in the selected chip, the RWDS signal changes to a low level.

When the signal CLK2F_t is a high level, the signal VINT is latched, and the signal VIOUT changes to a high level. Then, the signal LTNCYSEL_c changes to a high level. At this time, the signal LTNCY2B_t is at the low level, so that in the selected chip, the RWDS signal remains at the low level.

In the second to fourth embodiments, the RWDS signals of these memory chips are all at the high levels in the first several clocks of the clock signal CK. For the memory controller, its control operation does not need to be changed, and is easy to implement in view of a system.

Figure 14:
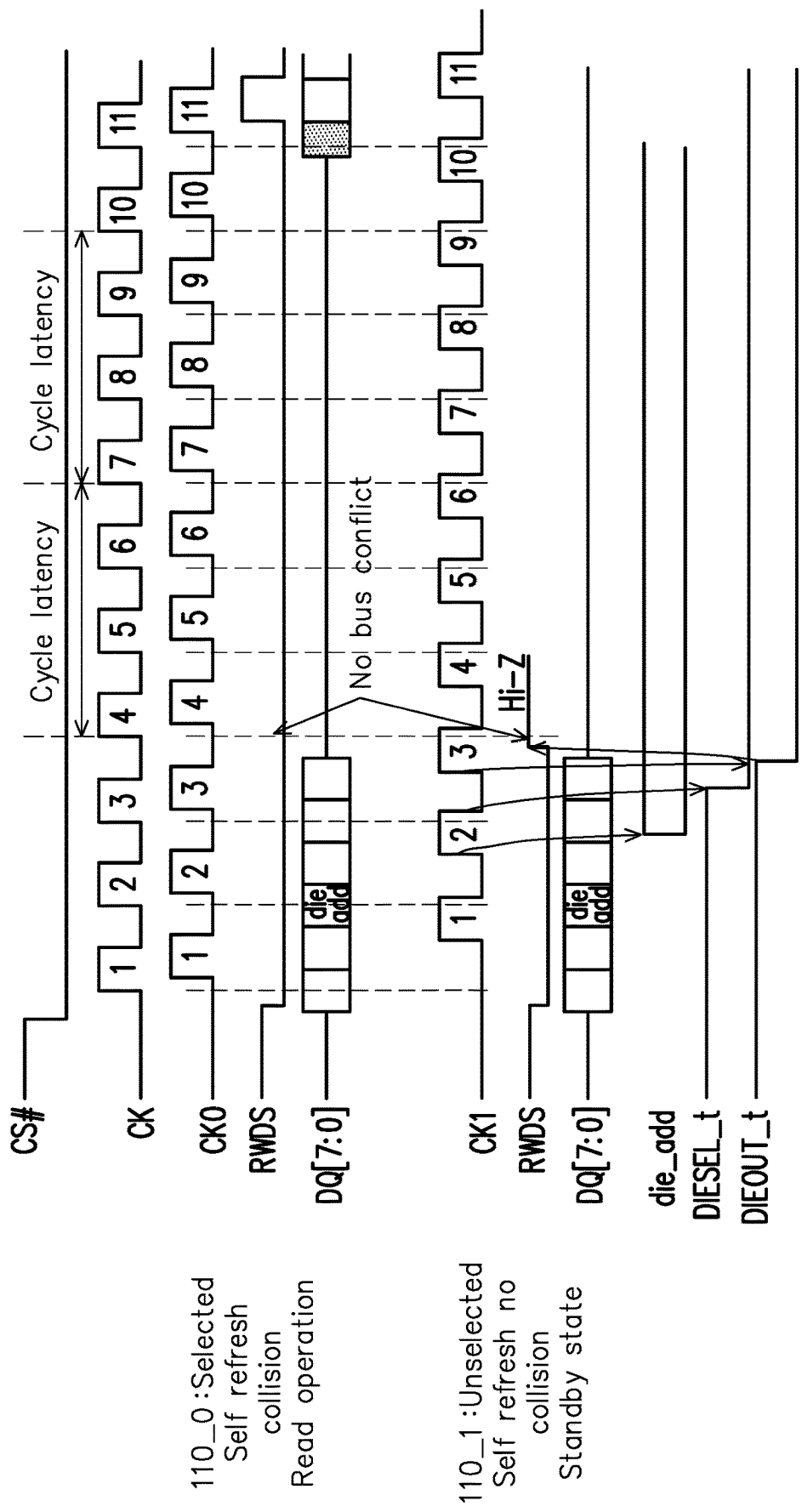
FIG. 14 is a diagram illustrating signal timing sequences of memory chips according to a fifth embodiment of the disclosure.

FIG. 14 is a diagram illustrating signal timing sequences of memory chips according to a fifth embodiment of the disclosure. In the present embodiment, the first memory chip 110_0 and the second memory chip 110_1 are, for example, xSPI pSRAMs or HyperRAM pSRAMs. The first memory chip 110_0 is selected to perform a read operation, and a self refresh collision occurs in the first memory chip 110_0. The second memory chip 110_1 is not selected, i.e. in a standby state, and no self refresh collision occurs in the second memory chip 110_1. The read latency of the first memory chip 110_0 is set to be a fixed period (for example, two units of cycle latency) that self refresh is allowed to be completed.

In the present embodiment, when the self refresh collision occurs, and the control signal CS# changes to a low level, the first memory chip 110_0 and the second memory chip 110_1 both output RWDS signals at low levels. After the cycle latency ends, the first memory chip 110_0 outputs an RWDS signal at a high level. Before the start of the cycle latency, the RWDS pin 130 of the second memory chip 110_1 changes to a Hi-Z state. Therefore, the bus conflict may be avoided at least at a time interval from the first clock to the third clock of the clock signal CK.

A method for operating the memory chips of the fifth embodiment is taken for example. FIG. 15A is a general diagram illustrating waveforms of main signals of the signal generation circuit 400 in the first memory chip 110_0, and FIG. 15B is a general diagram illustrating waveforms of main signals of the signal generation circuit 400 in the second memory chip 110_1. In the present embodiment, by setting the signal DISLTNCY2_c to be at a low level, even if the signal LTNCY2_t changes to a high level, the signal LTNCY2A_c may also be remained at a high level. Therefore, when the control signal CS# changes to a low level, the first memory chip 110_0 and the second memory chip 110_1 may output RWDS signals at low levels.

Referring to FIG. 9 and FIG. 15A to FIG. 15B, in FIG. 15A and FIG. 15B, when the signal CE_c is at a low level, the signal LTNCY2_t changes to a high level. However, since the signal DISLTNCY_c is at the low level, the signal LTNCY2A_c remains at the high level, and the signal LTNCY2B_t is at a low level.

When the signal CED_c is at a low level, the signal LTNCYSEL_c changes to a low level. Since the signal LTNCY2A_c is at the high level, and the signal LTNCY-SEL_c is at the low level, the signal LTNCY2B_t remains at the low level.

When the CED2_c is at a low level, since the signal DIEOUT_t is at a high level, and the signal WROUT_c is at the high level, the signal OUTQSLZ_t changes to a high level, and the RWDS signal changes to a low level. Since the signal LTNCY2B_t is at the low level, and the signal OUTQSLZ_t is at the high level, the RWDS signal is at a low level.

When the signal CLK2R_t is at a high level, in the unselected chip, the signal DIESEL_t is latched, and the signal DIEOUT_t changes to a low level. Since the signal DIEOUT_t is at the low level, the signal OUTQSLZ_t changes to a low level, and in the unselected chip, the RWDS pin 130 is in a Hi-Z state.

When the CLK2R_t is at the high level, and the signal CLK_t is at a low level, the signal WRITE_t is latched, and a circuit operation manner thereof is similar to that of the embodiment of FIG. 10A and FIG. 10B. The signal SPI_c is latched. However, no matter what a value of the signal SPIOUT_c is, the signal LTNCY2A_c remains at the high level, and the signal LTNCY2B_c remains at the low level.

When the signal CLK2F_t is a high level, the signal VINT is latched, and the signal VIOUT changes to a high level. Then, the signal LTNCYSEL_c changes to a high level. Since the signal LTNCY2A_c remains at the high level, the signal LTNCY2B_c remains at a low level. Since the signal OUTQSLZ_t is at the high level, and the signal LTNCY2B_t is at the low level, in the selected chip, the RWDS signal remains at the low level.

Figure 16:
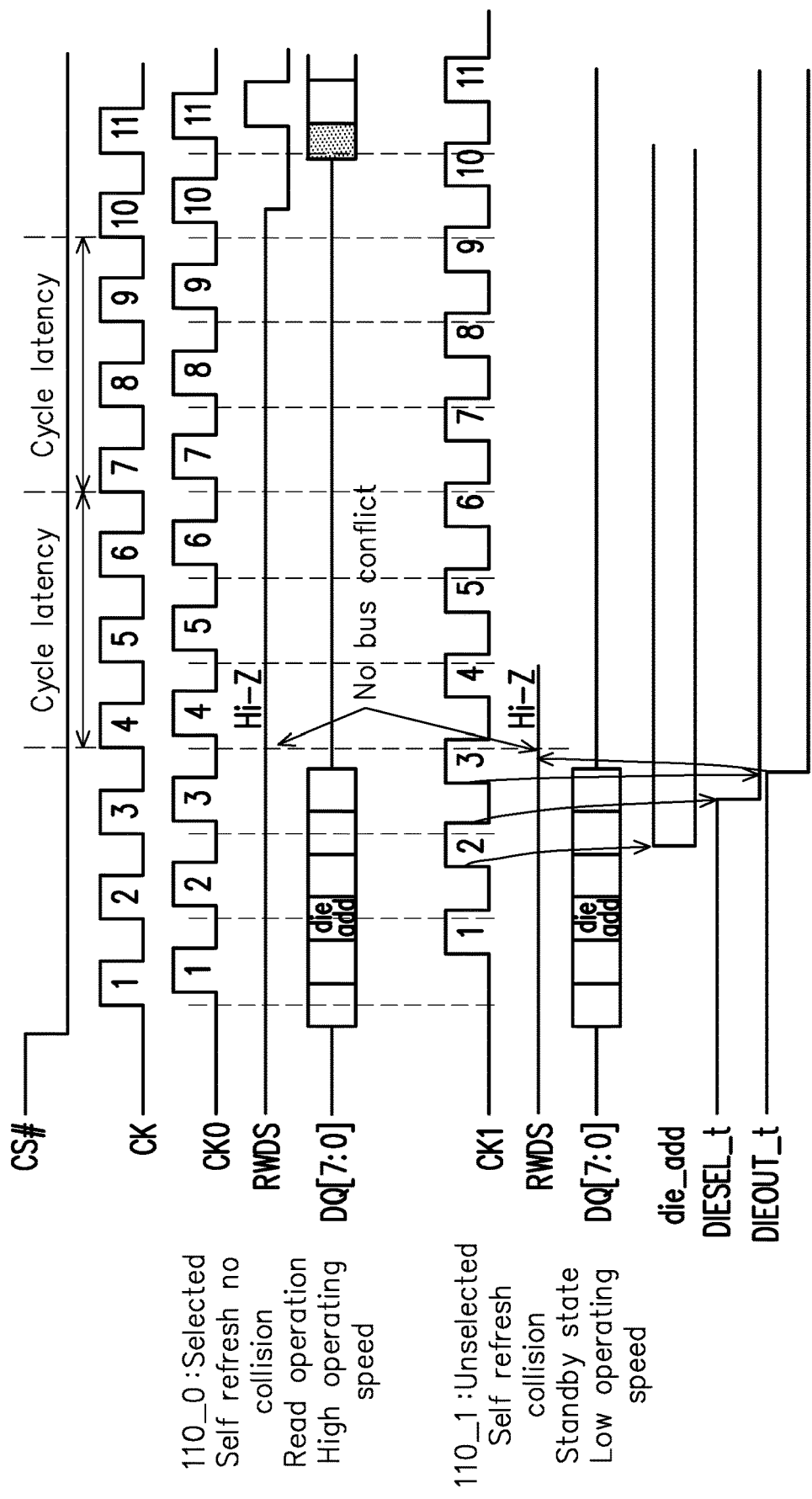
FIG. 16 is diagram illustrating signal timing sequences of memory chips according to a sixth embodiment of the disclosure.

FIG. 16 is a diagram illustrating signal timing sequences of memory chips according to a sixth embodiment of the disclosure. Referring to FIG. 3 and FIG. 16, in the sixth embodiment, the first memory chip 110_0 and the second memory chip 110_1 are, for example, xSPI pSRAMs or HyperRAM pSRAMs. In the present embodiment, the first memory chip 110_0 has a higher operating speed. The first memory chip 110_0 is selected to perform a read operation, and no self refresh collision occurs in the first memory chip 110_0. The second memory chip 110_1 is not selected (in a standby state), and a self refresh collision occurs in the second memory chip 110_1.

In the present embodiment, when the control signal CS# changes to a low level, the RWDS pins 130 of the first memory chip 110_0 and the second memory chip 110_1 are both in a Hi-Z state. After the cycle latency ends, the first memory chip 110_0 outputs an RWDS signal at a low level. Before the start of the cycle latency, the RWDS of the second memory chip 110_1 remains in a Hi-Z state. Therefore, the bus conflict may be avoided at least at a time interval from the first clock to the third clock of the clock signal CK.

Figure 17B:
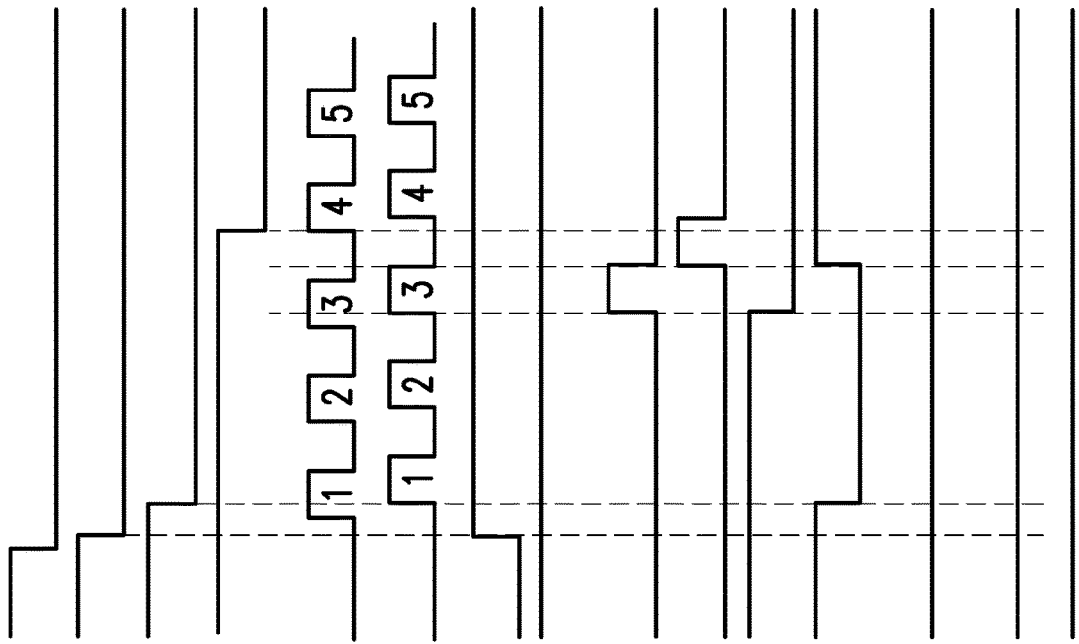
FIG. 17B is a general diagram illustrating waveforms of main signals of a signal generation circuit in a second memory chip according to the sixth embodiment.
Figure 17A:
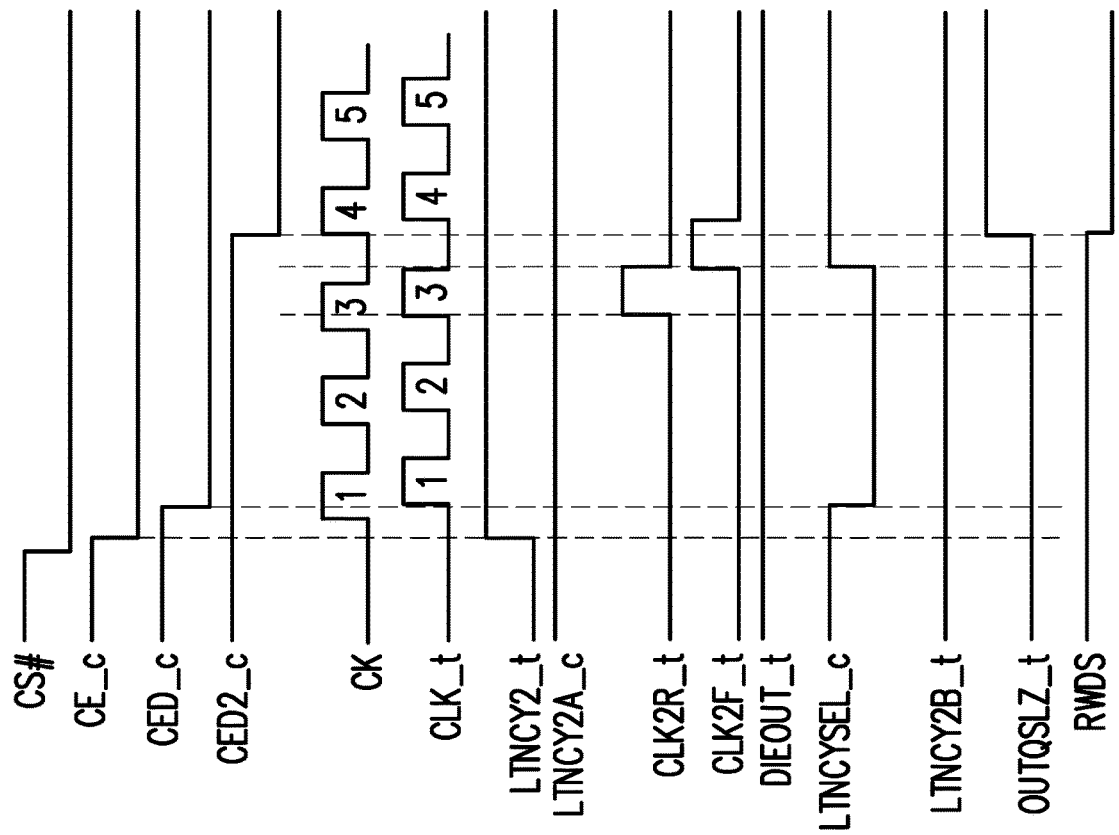
FIG. 17A is a general diagram illustrating waveforms of main signals of a signal generation circuit in a first memory chip according to the sixth embodiment.

A method for operating the memory chips of the sixth embodiment is taken for example. FIG. 17A is a general diagram illustrating waveforms of main signals of the signal generation circuit 400 in the first memory chip 110_0, and FIG. 17B is a general diagram illustrating waveforms of main signals of the signal generation circuit 400 in the second memory chip 110_1. In the present embodiment, by setting the signal DISLTNCY2_c to be at a low level, even if the signal LTNCY2_t changes to a high level, the signal LTNCY2A_c may still be remained at a high level. Therefore, when the control signal CS# is at a low level, outputs of the RWDS pins 130 of the first memory chip 110_0 and the second memory chip 110_1 are in a Hi-Z state.

Referring to FIG. 9 and FIG. 17A to FIG. 17B, in FIG. 17A and FIG. 17B, when the signal CE_c is at a low level, the signal LTNCY2_t changes to a high level. However, since the signal DISLTNCY_c is at the low level, the signal LTNCY2A_c remains at the high level, and the signal LTNCY2B_t is at a low level.

When the signal CED_c is at a low level, the signal LTNCYSEL_c changes to a low level. Since the signal LTNCY2A_c is at the high level, and the signal LTNCYSEL_c is at the low level, the signal LTNCY2B_t remains at the low level.

When the signal CED2_c is at the low level, the signal WROUT_c changes to a high level, which is an inverted value of a signal WROUT_t at a low level. In the selected chip, since the signal DIEOUT_t is at a high level, and the signal WROUT_c is at the high level, the signal OUTQSLZ_t changes to a high level, and the RWDS signal changes to a low level. Since the signal LTNCY2B_t is at the low level, and the signal OUTQSLZ_t is at the high level, the RWDS signal changes to a low level. In the unselected chip, since the signal DIEOUT_t is at a low level, the signal OUTQSLZ_t remains at a low level, and the RWDS signal remains at the low level.

When the signal CLK2R_t is at a high level, in the unselected chip, the signal DIESEL_t is latched, and the signal DIEOUT_t changes to a low level. At this time, the signal OUTQSLZ_t is at a low level, and in the unselected chip and the selected chip, the RWDS pins 130 are in a Hi-Z state.

When the signal CLK2R_t is at the high level, and the signal CLK_t is at a low level, the signal WRITE_t is latched, and a circuit operation manner thereof is similar to that of the embodiment of FIG. 10A and FIG. 10B. The signal SPI_c is latched. However, no matter what a value of the signal SPIOUT_c is, the signal LTNCY2A_c remains at the high level, and the signal LTNCY2B_c remains at the low level.

When the signal CLK2F_t is a high level, the signal VINT is latched, and the signal VIOUT changes to a high level. Then, the signal LTNCYSEL_c changes to a high level. Since the signal LTNCY2A_c remains at the high level, the signal LTNCY2B_c remains at the low level. Since the signal OUTQSLZ_t is at the low level, and the signal LTNCY2B_t is at the low level, in the unselected chip and the selected chip, the RWDS pins 130 are in a Hi-Z state.

In the fifth to sixth embodiments, the RWDS signals of these memory chips at the first several clocks of the clock signal CK are all in a same state (at a same low level or in a same high-impedance state), so that the bus conflict may be prevented. In addition, compared to the second to fourth embodiments, in the sixth embodiment, before the start of output of the valid data, the RWDS signal of the first memory chip 110_0 changes from the low level or the high-impedance state to a low level, instead of changing from a high level to a low level, so that the RWDS signal easily remains at the low level.

Figure 18:
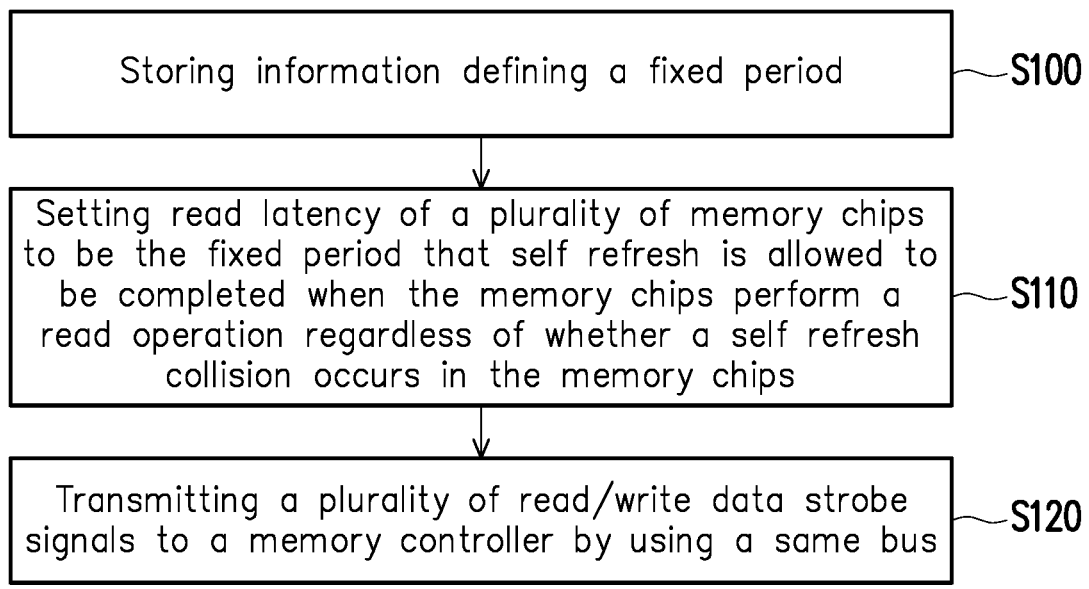
FIG. 18 is a flow chart illustrating steps of a method for operating a pSRAM according to one embodiment of the disclosure.

FIG. 18 is a flow chart illustrating steps of a method for operating a pSRAM according to one embodiment of the disclosure. Referring to FIG. 18, at the step S100, an information storing device (for example, a mode register 212 or a non-volatile memory 316) stores information defining a fixed period. At the step S110, no matter a self refresh collision occurs, a read latency of a first memory chip 110_0 and a second memory chip 110_1 is set to be a fixed period that self refresh is allowed to be completed. Furthermore, the levels of all the RWDS signals in the read latency are constant. The fixed period is greater than initial latency. At the step S120, the first memory chip 110_0 and the second memory chip 110_1 transmit the corresponding RWDS signals to a memory controller 500 by using a same bus 120. Enough teaching, suggestion and implementation illustrations can be obtained from the disclosed contents of the embodiments from FIG. 3 to FIG. 17B for the detailed steps of the method for operating the pSRAM of the present embodiment.

Based on the above, in the embodiments of the disclosure, the methods for operating the memory chips can avoid the bus conflict, so as to reduce current consumption, improve chip characteristics, and increase reliability of the chips. Even if the memory chips are manufactured by different wafer manufacturing procedures to have different operating speeds, the methods for operating the memory chips may also avoid the bus conflict. In the embodiments of the disclosure, the RWDS signals corresponding to these memory chips are all at the same level in the first several clocks of the clock signal. For the memory controller, its control operation does not need to be changed, and is easy to implement in view of the system. In one embodiment of the disclosure, before the start of the output of the valid data, the RWDS signals of the selected memory chips change from the low level or the high-impedance state into a low level, so that the RWDS signals easily remain at the low level.

Although the present disclosure has been disclosed as above by way of embodiments, it is not intended to limit the present disclosure. Any person with ordinary knowledge in the technical field can make some changes and modifications without departing from the spirit and scope of the present disclosure. Therefore, the protection scope of the present disclosure shall be determined by the scope of the attached patent application.

What is claimed is:

1. A pseudo static random access memory, coupled to a memory controller, the pseudo static random access memory comprising:

a plurality of memory chips, transmitting a plurality of read/write data strobe signals to the memory controller by using a same bus, wherein, regardless of whether a self refresh collision occurs in the plurality of memory chips, when the plurality of memory chips perform a read operation, read latency of the plurality of memory chips is set to be a fixed period for allowing completion of self refresh, and the fixed period is greater than initial latency comprised in the read latency; and an information storing device, configured to store information defining the fixed period, wherein before the read latency, the memory controller outputs a control signal to the plurality of memory chips, when the control signal changes from a first level to a second level, the plurality of read/write data strobe signals output by the plurality of memory chips are all in a same state, and a state of each of the plurality of read/write data strobe signals is constant during the read latency.

2. The pseudo static random access memory according to claim 1, wherein the information storing device is a mode register.

3. The pseudo static random access memory according to claim 1, wherein the information storing device is a non-volatile memory.

4. The pseudo static random access memory according to claim 1, wherein when the control signal changes from the first level to the second level, the plurality of memory chips output the plurality of read/write data strobe signals at the first level to the memory controller.

5. The pseudo static random access memory according to claim 4, wherein the plurality of memory chips comprise a first memory chip and a second memory chip, the first memory chip is selected to perform the read operation, the second memory chip is not selected, and before the read latency, the read/write data strobe signal output by the first memory chip changes from the first level to the second level, and the read/write data strobe signal output by the second memory chip changes from the first level to a high-impedance state.

6. The pseudo static random access memory according to claim 5, wherein a timing sequence when the first memory chip outputs the read/write data strobe signal at the second level is later than a timing sequence when a chip address is determined.

7. The pseudo static random access memory according to claim 5, wherein the timing sequence that the first memory chip outputs the read/write data strobe signal at the second level is not earlier than a timing sequence that the second memory chip outputs the read/write data strobe signal in the high-impedance state.

8. The pseudo static random access memory according to claim 1, wherein when the control signal changes from the first level to the second level, the plurality of read/write data strobe signals output by the plurality of memory chips are in the same state but are not at the first level.

9. The pseudo static random access memory according to claim 8, wherein, the plurality of memory chips output the plurality of read/write data strobe signals at the second level to the memory controller when the control signal changes from the first level to the second level.

10. The pseudo static random access memory according to claim 9, wherein the plurality of memory chips comprise a first memory chip and a second memory chip, the first memory chip is selected to perform the read operation, the second memory chip is not selected, the first memory chip outputs the read/write data strobe signal at the first level after the read latency ends, and the read/write data strobe signal of the second memory chip changes from the second level to a high-impedance state before the read latency.

11. The pseudo static random access memory according to claim 8, wherein a read/write data strobe pin of each of the memory chips is in a high-impedance state when the control signal changes from the first level to the second level.

12. The pseudo static random access memory according to claim 11, wherein the plurality of memory chips comprise a first memory chip and a second memory chip, the first memory chip is selected to perform the read operation, the second memory chip is not selected, the read/write data strobe signal output by the first memory chip changes from the high-impedance state to the second level after the read latency ends, and the read/write data strobe pin of the second memory chip remains in the high-impedance state before the read latency.

13. The pseudo static random access memory according to claim 1, wherein each of the memory chips comprises a signal generation circuit, and the signal generation circuit is configured to generate the read/write data strobe signal or to enable a read/write data strobe pin of each of the memory chips to be in a high-impedance state.

14. A method for operating a pseudo static random access memory, wherein the pseudo static random access memory comprises a plurality of memory chips and an information storing device, and the method for operating the pseudo static random access memory comprises:

storing information defining a fixed period for allowing completion of self refresh in the information storing device;

setting read latency of the plurality of memory chips to be the fixed period when the plurality of memory chips perform a read operation regardless of whether a self refresh collision occurs in the plurality of memory chips, wherein the fixed period is greater than initial latency comprised in the read latency; and transmitting a plurality of read/write data strobe signals to a memory controller by using a same bus, wherein before the read latency, the memory controller outputs a control signal to the plurality of memory chips, when the control signal changes from a first level to a second level, the plurality of read/write data strobe signals output by the plurality of memory chips are all in a same state, and a state of each of the plurality of read/write data strobe signals is constant during the read latency.

15. The method for operating the pseudo static random access memory according to claim 14, further comprising:

when the control signal changes from the first level to the second level, outputting the plurality of read/write data strobe signals at the first level to the memory controller.

16. The method for operating the pseudo static random access memory according to claim 15, wherein the plurality of memory chips comprise a first memory chip and a second memory chip, the first memory chip is selected to perform the read operation, the second memory chip is not selected, and before the read latency, the read/write data strobe signal output by the first memory chip changes from the first level to the second level, and the read/write data strobe signal output by the second memory chip changes from the first level to a high-impedance state.

17. The method for operating the pseudo static random access memory according to claim 16, wherein the timing sequence that the first memory chip outputs the read/write data strobe signal at the second level is not earlier than a timing sequence that the second memory chip outputs the read/write data strobe signal in the high-impedance state.

18. The method for operating the pseudo static random access memory according to claim 14, further comprising:
outputting the plurality of read/write data strobe signals at the second level to the memory controller when the control signal changes from the first level to the second level.

19. The method for operating the pseudo static random access memory according to claim 18,
wherein the plurality of memory chips comprise a first memory chip and a second memory chip, the first memory chip is selected to perform the read operation, the second memory chip is not selected, the first memory chip outputs the read/write data strobe signal at the first level after the read latency ends, and the read/write data strobe signal of the second memory chip changes from the second level to a high-impedance state before the read latency.

20. The method for operating the pseudo static random access memory according to claim 14, further comprising:
enabling a read/write data strobe pin of each of the memory chips to be in a high-impedance state when the control signal changes from the first level to the second level.

* * * * *